United States Patent [19]

Miyazaki et al.

[11] Patent Number: 5,328,786
[45] Date of Patent: Jul. 12, 1994

[54] PHOTOMASK AND METHOD OF MANUFACTURING THE SAME

[75] Inventors: Junji Miyazaki; Hitoshi Nagata, both if Itami, Japan

[73] Assignee: Mitsubishi Denki Kabushiki Kaisha, Tokyo, Japan

[21] Appl. No.: 760,383

[22] Filed: Sep. 16, 1991

[30] Foreign Application Priority Data

Oct. 9, 1990 [JP] Japan ................. 2-272635

[51] Int. Cl.$^5$ ................. G03F 9/00
[52] U.S. Cl. ................. 430/5; 430/324; 430/322
[58] Field of Search ........ 430/5, 22, 269, 324, 430/322

[56] References Cited

U.S. PATENT DOCUMENTS 5,045,417 9/1991 Okamoto ................. 430/5

FOREIGN PATENT DOCUMENTS 0383534 8/1990 European Pat. Off. .

Primary Examiner—Steve Rosasco
Attorney, Agent, or Firm—Oblon, Spivak, McClelland, Maier & Neustadt

[57] ABSTRACT

The relations in phase between first and second phase regions which are disposed on both sides of light-blocking regions interposing between them are arranged that there is a phase difference between the lights transmitted by the first and second phase regions enough to cancel with each other because of the interference, while the relations in phase between the first and second phase regions and third phase region disposed adjacent to them are arranged that between the lights transmitted by them there is a phase difference about a half of the phase difference between the lights transmitted by the first and second phase regions. Thus, the lights transmitted by the first and second phase regions and prevailing in the back sides of the light-blocking regions cancel with each other because of the interference to enchance the accuracy of the transfer at the edge portions of the light-blocking regions. Moreover, the cancellation of the lights caused by the interference at the boundaries separating the third phase region from the first and second phase regions is weakened to an extent that it exerts no effect on the transference of the pattern. As a result, the mask pattern can be transferred with high resolution without any effect of the configurations of the light-blocking regions.

23 Claims, 38 Drawing Sheets

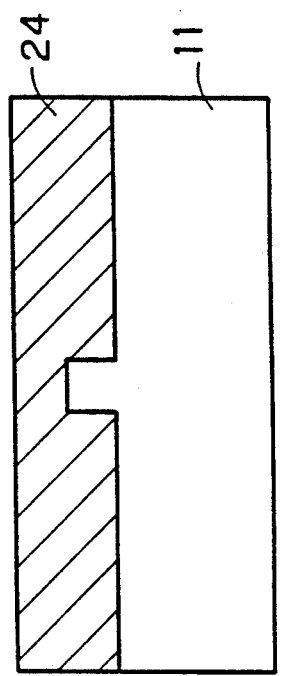
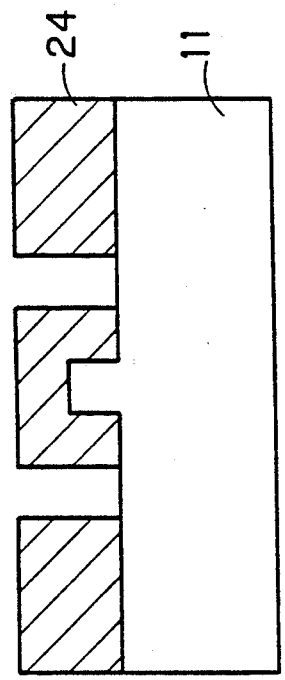
FIG. 16I
FIG. 16J
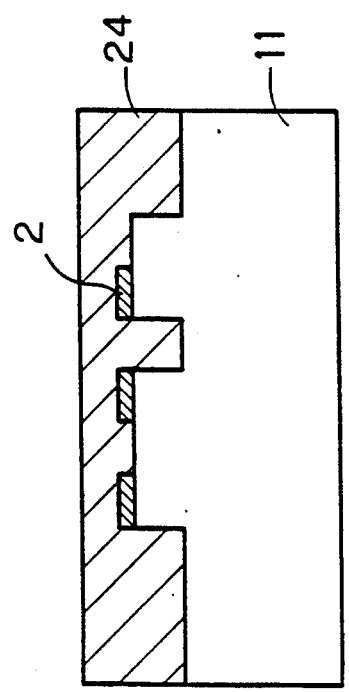
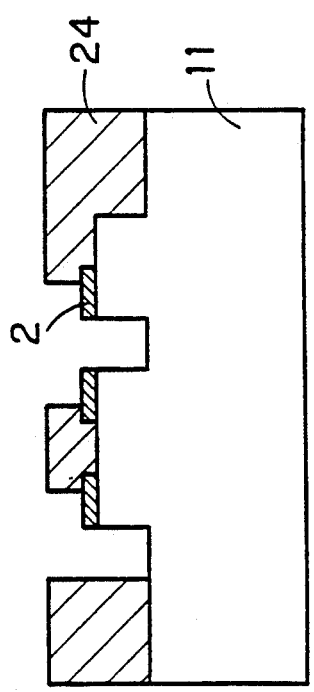
FIG. 15I
FIG. 15J

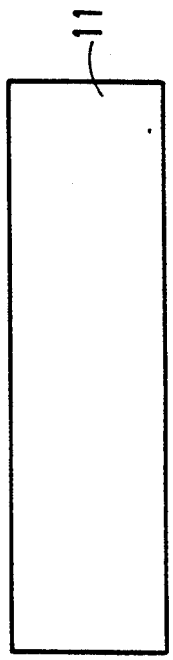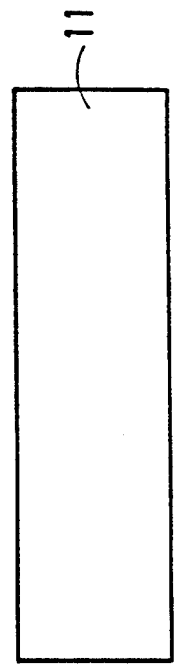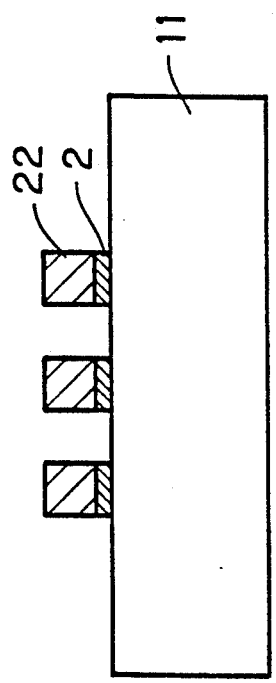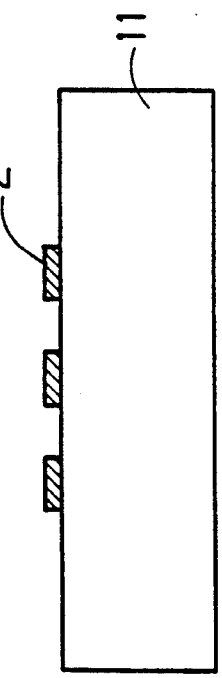

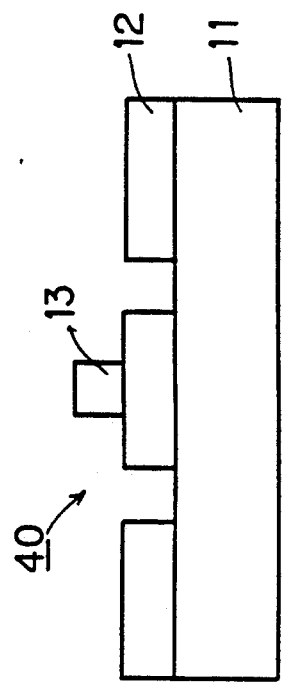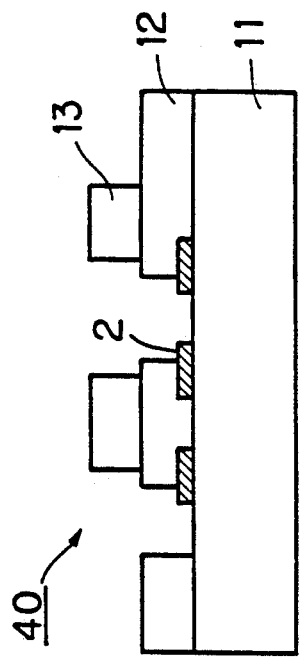

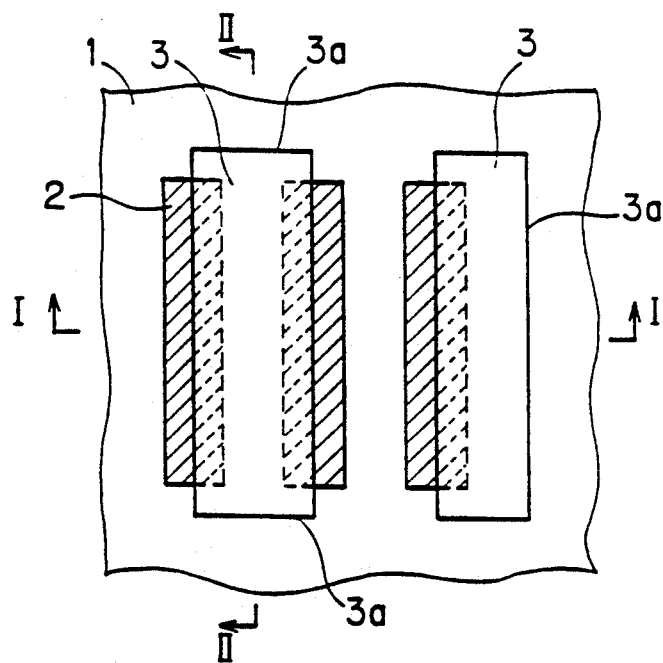
FIG. 23 (A)
(PRIOR ART)
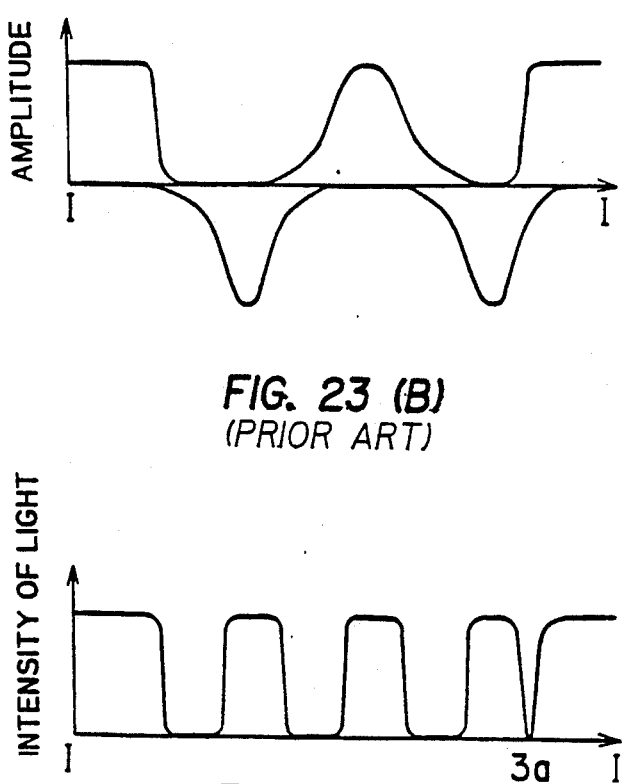
FIG. 23 (B)
(PRIOR ART)
FIG. 23 (C)
(PRIOR ART)
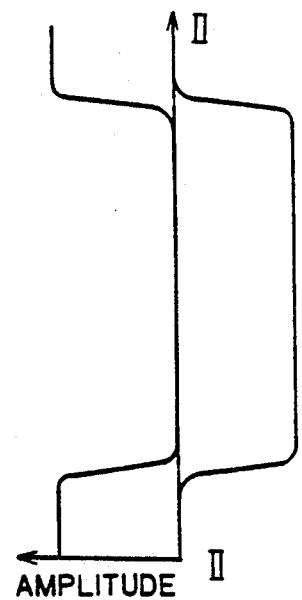
FIG. 23 (D)
(PRIOR ART)
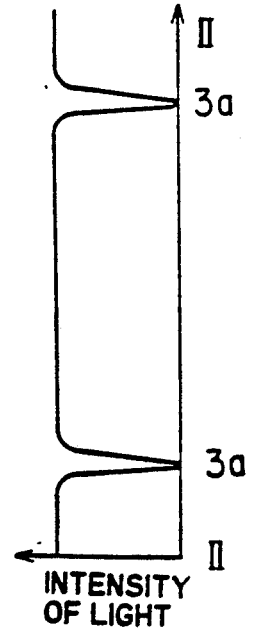
FIG. 23 (E)
(PRIOR ART)

PHOTOMASK AND METHOD OF MANUFACTURING THE SAME

BACKGROUND OF THE INVENTION

1. Field of the Invention

The present invention relates to a photomask employed for a lithography process in manufacturing a semiconductor device, and to a method of manufacturing the photomask.

2. Description of the Prior Art

Generally, in the lithography process, a photomask with a particular transfer pattern formed of regions transparent to light and regions opaque to block the light is employed. The photomask is projected through a lens system onto a processed substrate having a photosensitive material layer, in order to transfer the pattern.

A sectional view of a prior art photomask is shown in (a) of FIG. 21. On the surface of a transparent substrate 1 of glass or the like, light-blocking regions 2 of Cr, MoSi or the like are formed. Because of the light-blocking regions 2, a transfer pattern is defined.

In the projected image of the photomask manufactured as mentioned above, as shown in a distribution diagram of amplitude in (b) of FIG. 21, the light transmitted by the transparent substrate 1 prevails even in the light-blocking regions 2 because of the diffraction. Since the practical light intensity is obtained as the amplitude raised to the second power, the prevalence of the light in the light-blocking regions 2 is observed, as shown in a distribution diagram of the intensity of light in (c) of FIG. 21. Thus, the resolution on the pattern transference is reduced, and there is difficulty in transferring a minute pattern with high accuracy.

As a method of preventing the reduction of the resolution caused by the diffraction, Japanese Examined Patent Publication No. 50811/1987 discloses a phase shift technique. According to this method, when transparent portions T1, T2 and so forth and light-blocking portions S1, S2, S3 and so forth of a photomask are alternately arranged as shown in (a) of FIG. 22, phase regions 3 are formed in every other one of the transparent portions T1, T2 and so forth along the direction of arrays of them. For example, in the transparent portion T2, one of the phase region 3 is formed on the transparent substrate 1 between the adjacent light-blocking regions 2. The phase region 3 has a thickness which makes a phase difference of 180° between the lights transmitted and not transmitted by the phase region 3.

Thus, the lights prevailing in the light-blocking portions after transmitted by the adjacent transparent portions, as shown in (b) and (c) of FIG. 22, cancel with each other because of the interference. For example, the lights transmitted by the transparent portions T1, T2 and prevailing in the light-blocking portions S2 interfere to cancel with each other in the light-blocking portion S2. As a result, the resolution of the photomask is improved.

In FIG. 23, (a) shows a plan view of another embodiment of the photomask employing a structure shown in (a) of FIG. 22; wherein there are three of the light-blocking regions 2 of the same dimensions, disposed in parallel at the same interval. In FIG. 23, (b) shows a distribution diagram of the amplitude of the light transmitted by the area along the line I—I of FIG. 23, (a), while (c) shows a distribution diagram of the intensity of the light transmitted by the area along the line I—I; and (d) shows a distribution diagram of the amplitude of the light transmitted by the area along the line II—II of FIG. 23, (a), while (e) shows a distribution diagram of the intensity of the light transmitted by the area along the line II—II.

As will be recognized in (a) of FIG. 23, the photomask employing the above-mentioned structure is provided with a part 3a which is in the peripheral portion of the phase region 3 and is contiguous to the transparent substrate 1. As shown in (b) and (d) of FIG. 23, the light transmitted by the phase region 3 and the light transmitted by the transparent substrate 1 are out of phase by 180°, and in the boundary part 3a both the transmitted lights cancel with each other because of the interference. Consequently, as shown in (c) and (e) of FIG. 23, the intensity of light in the boundary 3a declines to naught.

As a result, when a photoresist layer on a processed substrate is developed with a mask pattern of the above-mentioned photomask transferred, if a photoresist layer 5 on the processed substrate 4 is of positive-type as shown in FIG. 24, the resist is left in an area encircled by a dash-dot line 6 in FIG. 24 from which the resist should have been removed. Contrarily, if the photoresist layer 5 is of negative-type, the resist is removed from an area in which the resist should have been left. The mask pattern practically employed in manufacturing a semiconductor device has the light-blocking regions 2 which are generally configured like isolated islands as shown in (a) of FIG. 23, and hence, there arises the problem that the phase region 3 as mentioned above can not be provided in some case or other.

SUMMARY OF THE INVENTION

The present invention is directed to a photomask employed in a lithography process and to a method of manufacturing the same.

In a first aspect of the present invention, a photomask comprises a plurality of light-blocking regions arranged in parallel on a transparent member; the transparent member including (a) first and second phase regions alternately disposed along the direction of arrays of the light-blocking regions, with each of the light-blocking regions interposing between them and (b) a third phase region disposed adjacent to the first and second phase regions; the relations in phase between the first and second phase regions being arranged that the lights transmitted by the first and second phase regions have a phase difference enough to cancel with each other because of the interference; and the relations in phase of the third phase region to the first and second phase regions being arranged that the phase difference between the lights transmitted by the first and third phase regions, and the phase difference between the lights transmitted by the second and third phase regions are about a half of the phase difference between the lights transmitted by the first and second phase regions.

In a second aspect of the present invention, a method of manufacturing a photomask having a plurality of light-blocking regions disposed in parallel, first and second phase regions alternately disposed along the direction of arrays of the light-blocking regions, with each of the light-blocking regions interposing between them, and a third phase region disposed adjacent to the first and second phase regions, comprises the steps of forming a first phase film, a second phase film and a light-blocking film on a transparent substrate in this order, forming the light-blocking regions disposed in parallel by selectively removing the light-blocking film by etching, selectively removing by etching the regions in the second phase film corresponding to the first and third phase regions, and selectively removing by etching the region in the first phase film corresponding to the first phase region.

In a third aspect of the present invention, a method of manufacturing a photomask having a plurality of light-blocking regions disposed in parallel, first and second phase regions alternately disposed along the direction of arrays of the light-blocking regions, with each of the light-blocking regions interposing between them, and a third phase region disposed adjacent to the first and second phase regions, comprising the steps of forming a light-blocking film on a transparent substrate, forming the light-blocking regions disposed in parallel by selectively removing the light-blocking film by etching, selectively removing the region in an exposed region of the transparent substrate corresponding to the first and third phase regions by etching by a particular depth, and further selectively removing the region in the exposed region of the transparent substrate corresponding to the first phase region by etching to a particular depth.

In a fourth aspect of the present invention, a method of manufacturing a photomask having a plurality of light-blocking regions disposed in parallel, first and second phase regions alternately disposed along the direction of arrays of the light-blocking regions, with each of the light-blocking regions interposing between them, and a third phase region disposed adjacent to the first and second phase regions, comprising the steps of forming a light-blocking film on a transparent substrate, forming the light-blocking regions disposed in parallel by selectively removing the light-blocking film by etching, selectively forming a phase film on the region in an exposed region of the transparent substrate corresponding to the second phase region, and selectively removing the region in the exposed region of the transparent substrate corresponding to the first phase region to etching to a particular depth.

In a fifth aspect of the present invention, a method of manufacturing a photomask having a plurality of light-blocking regions disposed in parallel, first and second phase regions alternately disposed along the direction of arrays of the light-blocking regions, with each of the light-blocking regions interposing between them, and a third phase region disposed adjacent to the first and second phase regions, comprising the steps of forming a light-blocking film on a transparent substrate, forming the light-blocking regions disposed in parallel by selectively removing the light-blocking film by etching, selectively forming a first phase film on the region in an exposed region of the transparent substrate corresponding to the second and third phase regions, and selectively forming a second phase film on the region in the first phase film corresponding to the second phase region.

Accordingly, it is a general object of the present invention to provide a photomask by which a mask pattern can be transferred with high resolution without an effect of the configuration of a light-blocking region, and to provide a method of manufacturing the photomask.

With the photomask in the first aspect of the present invention, the relations in phase between the first and second phase regions which are disposed on both sides of each light-blocking region are arranged that there is a phase difference between the lights transmitted by those phase regions enough to cancel with each other because of the interference. Therefore, the lights transmitted by the first and second phase regions and prevailing in the back sides of the light-blocking regions cancel with each other because of the interference, and the transference accuracy in the edge portions of the light-blocking regions is enhanced. Moreover, the relations in phase between the first and second phase regions and the third phase region disposed adjacent to them are arranged that between the lights transmitted by them there is a phase difference about a half of the phase difference between the lights transmitted by the first and second phase regions. Therefore, the cancellation of the lights caused by the interference at the boundaries between the third phase region and the first and second phase regions is weakened to an extent that it exerts no effect on the transference of the pattern. In this case, the most desirable thing in enhancing the resolution is that it is arranged that the phase difference between the lights transmitted by the first and second phase regions should be 180°, while the phase differences between the lights transmitted by the first and third phase regions and between the lights transmitted by the second and third phase regions should be 90°, respectively.

With the methods of manufacturing a photomask in the second through fifth aspects according to the present invention, photomasks having the light-blocking regions and first through third phase regions as mentioned above can be manufactured, respectively.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 15A through 15L and FIGS. 16A through 16L are sectional views showing steps of manufacturing the photomask of the above-mentioned second embodiment;

FIGS. 17A through 17M and FIGS. 18A through 18M are sectional views showing steps of manufacturing the photomask of the above-mentioned third embodiment;

FIG. 23 is a diagram for explaining the effect of the prior art photomask; and

DETAILED DESCRIPTION OF THE PREFERRED EMBODIMENTS

Figure 1:
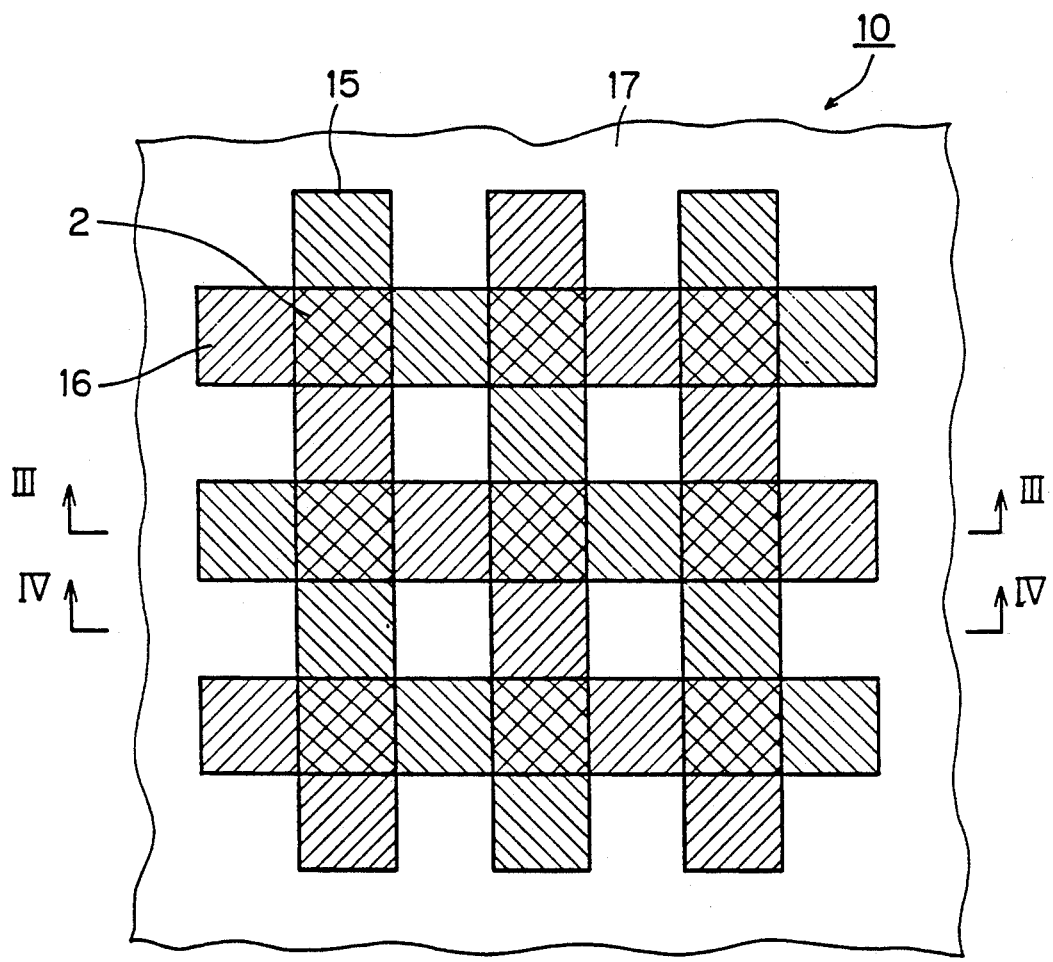
FIG. 1 is a plan view of a photomask of a first embodiment according to the present invention.
Figure 2A:
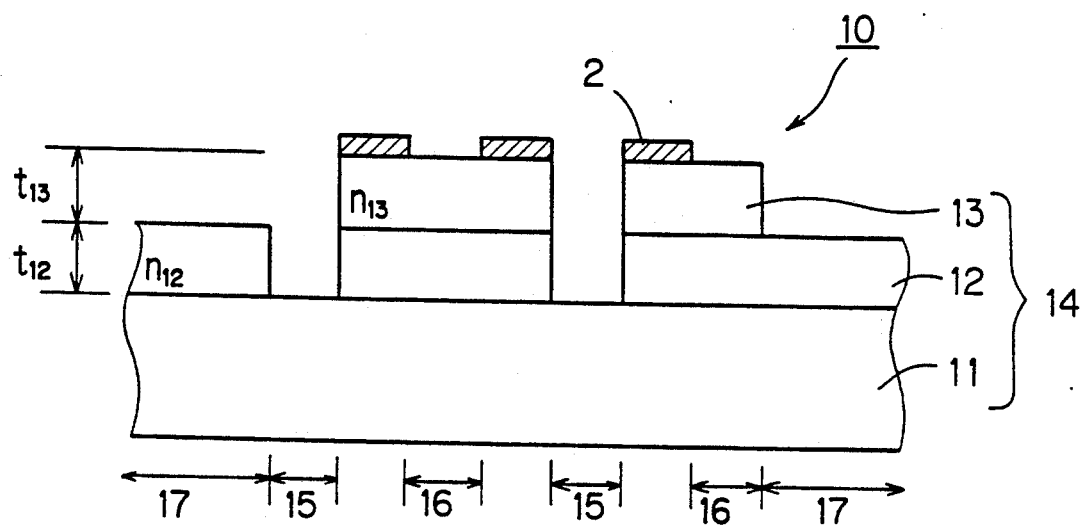
FIG. 2A is a sectional view taken along the line III—III of FIG. 1.
Figure 3A:
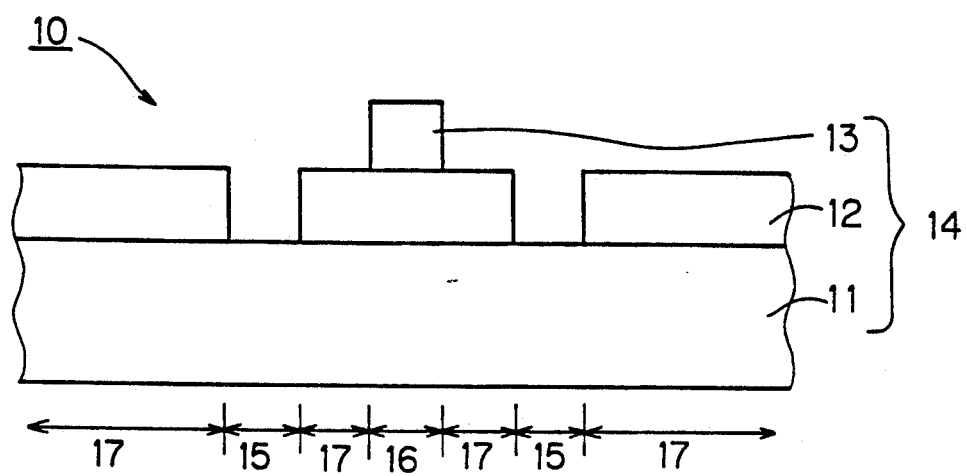
FIG. 3A is a sectional view taken along the line IV—IV of FIG. 1.

FIG. 1 is a plan view of a photomask of a first embodiment according to the present invention, FIG. 2A is a sectional view taken along the line III—III of FIG. 1, and FIG. 3A is a sectional view taken along the line IV—IV of FIG. 1.

As shown in these drawings, a photomask 10 has a matrix arrangement of a plurality of light-blocking regions 2 on a transparent member 14 consisting of a transparent substrate 11, a first phase film 12 and a second phase film 13. The transparent member 14 has a first phase region 15 formed of the transparent substrate 11, a second phase region 16 formed of the transparent substrate 11, the first phase film 12 and the second phase film 13, and a third phase region 17 formed of the transparent substrate 11 and the first phase film 12. The first and second phase regions 15 and 16 are alternately disposed in arrays along the row-and column- directions with each of the light-blocking regions 2 interposing between them, while the third phase region 17 is disposed adjacent to the first and second phase regions 15 and 16.

The transparent substrate 11 is made of, for example, silica glass ($SiO_2$).

The light-blocking regions 2 are made of Cr, MoSi or the like.

The first phase film 12 is made of, for example, $Si_3N_4$. The thickness of the first phase film 12 is determined so that both the lights transmitted and not transmitted by the first phase film 12 have a phase difference of $+90°$. For example, the thickness $t_{12}$ of the first phase film 12 is expressed as follows:

$$t_{12} = \frac{\lambda}{4(n_{12} - 1)} \quad (1)$$

where the wavelength of the exposing light is $\lambda$, and the refractive index of the first phase film 12 is $n_{12}$.

The second phase film 13 is made of, for example, $SiO_2$. The thickness of the second phase film 13 is determined so that the lights transmitted and not transmitted by the second phase film 13 are also out of phase by $+90°$. For example, the thickness $t_{13}$ of the second phase film 13 is expressed as follows:

$$t_{13} = \frac{\lambda}{4(n_{13} - 1)} \quad (2)$$

where the refractive index of the second phase film 13 is $n_{13}$.

Thus, the light transmitted by the first phase region 15 and the light transmitted by the second phase region 16 are out of phase by $+180°$, while the light transmitted by the first phase region 15 and the light transmitted by the third phase region 17 are out of phase by $90°$, and the light transmitted by the second phase region 16 and the light transmitted by the third phase region 17 are out of phase by $+90°$.

The intensity of light when two lights out of phase by $90°$ interfere with each other will now be discussed.

Generally, a composite wave U expressed by two lights $U_1$, $U_2$ which are defined as follows $$U_1 = a_1 \sin(\omega t + \theta_1)$$

$$U_2 = a_2 \sin(\omega t + \theta_2)$$

is expressed as follows:

$$U = U_1 + U_2 = a \sin(\omega t + \theta)$$

$$a = \sqrt{a_1^2 + a_2^2 + 2a_1 a_2 \cos(\theta_1 - \theta_2)}$$

$$\tan \theta = \frac{a_1 \sin \theta_1 + a_2 \sin \theta_2}{a_1 \cos \theta_1 + a_2 \cos \theta_2} \quad (3)$$

Figure 4:
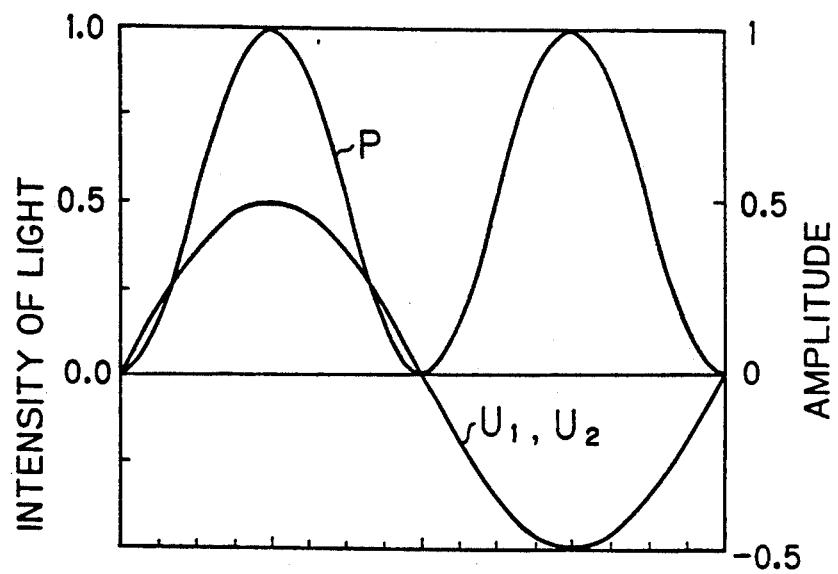
FIG. 4 is a diagram showing wave forms of the amplitudes of two beams of light in phase and wave forms of their interference intensities.

Now, assume that the lights $U_1$, $U_2$ in phase ($\theta_1 = \theta_2 = 0$) and the same amplitude ($a_1 = a_2 = 0.5$) interfere with each other, as shown in FIG. 4.

In this case, the following formula with regard to the lights $U_1$, $U_2$ is obtained something like $$U_1 = U_2 = 0.5 \sin \omega t$$

and the composite wave U is expressed according to the above formula (3), as follows:

$$U = \sin \omega t$$

The intensity of the composite light is expressed by the composite wave U raised to the second power, and therefore, the wave form of the intensity of light can be shown like a wave form P in FIG. 4. As can be seen, the intensity of the composite light becomes 1.

Figure 5:
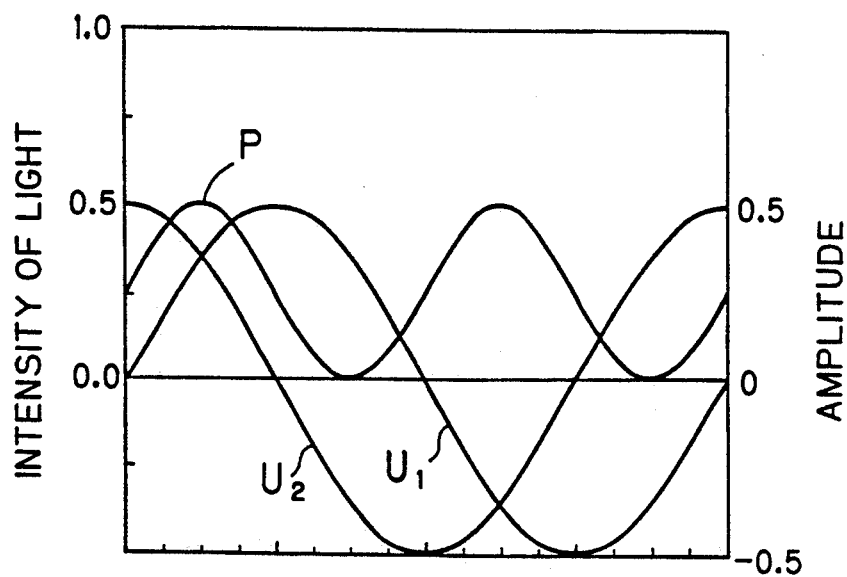
FIG. 5 is a diagram showing wave forms of the amplitudes of two beams of light out of phase by 90° and wave forms of their interference intensities.

Then, assume that the lights $U_1$, $U_2$ out of phase by $90°$ ($\theta_1 = 0$, $\theta_2 = 90°$) interfere with each other, as shown in FIG. 5; where the lights $U_1$, $U_2$ are of the same amplitude and $a_1 = a_2 = 0.5$ is satisfied. The following formulae are obtained with regard to the lights $U_1$, $U_2$ $$U_1 = 0.5 \sin \omega t$$

$$U_2 = 0.5 \sin(\omega t + 90°)$$

and the composite wave U is expressed according to the above formula (3), as follows:

$$U = 0.5 \sin(\omega t + 45°)$$

The intensity of the composite light is expressed by composite wave U raised to the second power, as previously mentioned, and hence, the wave form of the intensity of light is shown like a wave form P in FIG. 5. As can be seen, the intensity of the composite light becomes 0.5, a half amount of the case with the two lights in phase.

Now, a process of transferring the mask pattern to the photoresist on the processed substrate employing the photomask 10 according to this embodiment will be described.

Figure 2B:
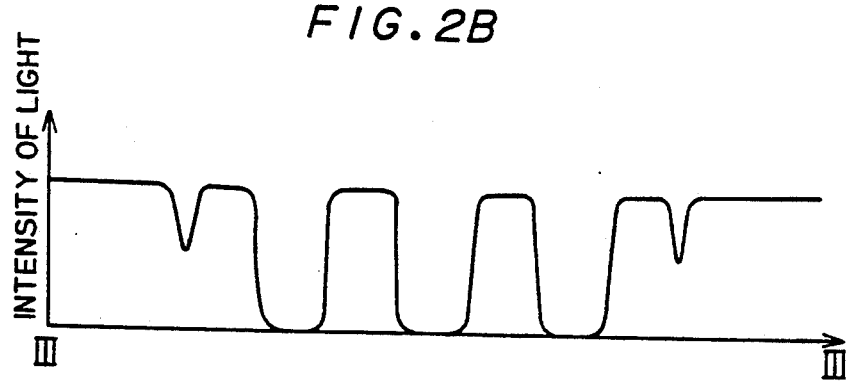
FIG. 2B is a distribution diagram of the intensity of light corresponding to regions in section of FIG. 2A.
Figure 22:
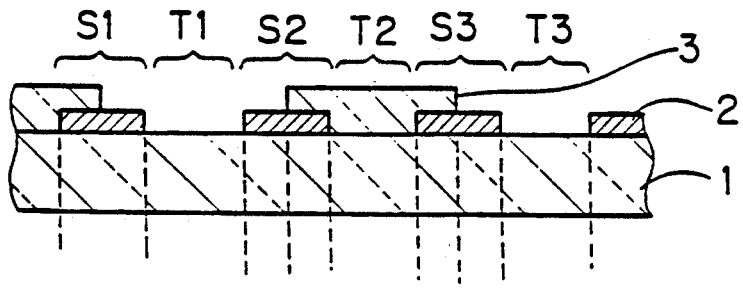
FIG. 22 is a diagram for explaining another prior art embodiment of the photomask.
Figure 22:
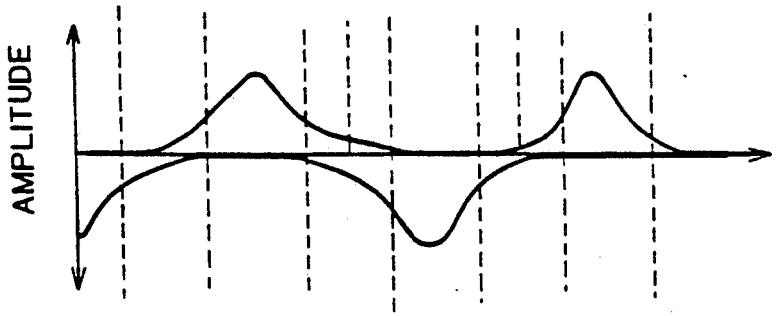
Figure 22:
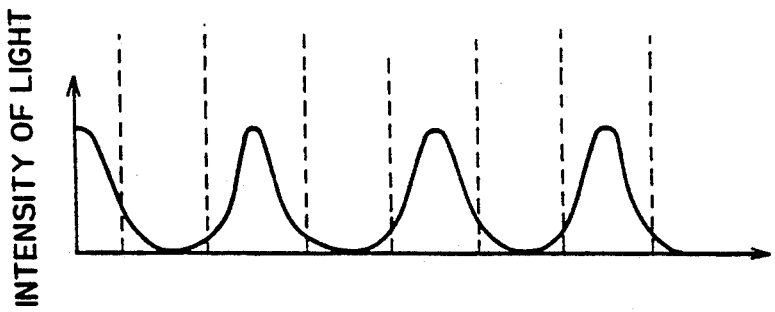
Figure 24:
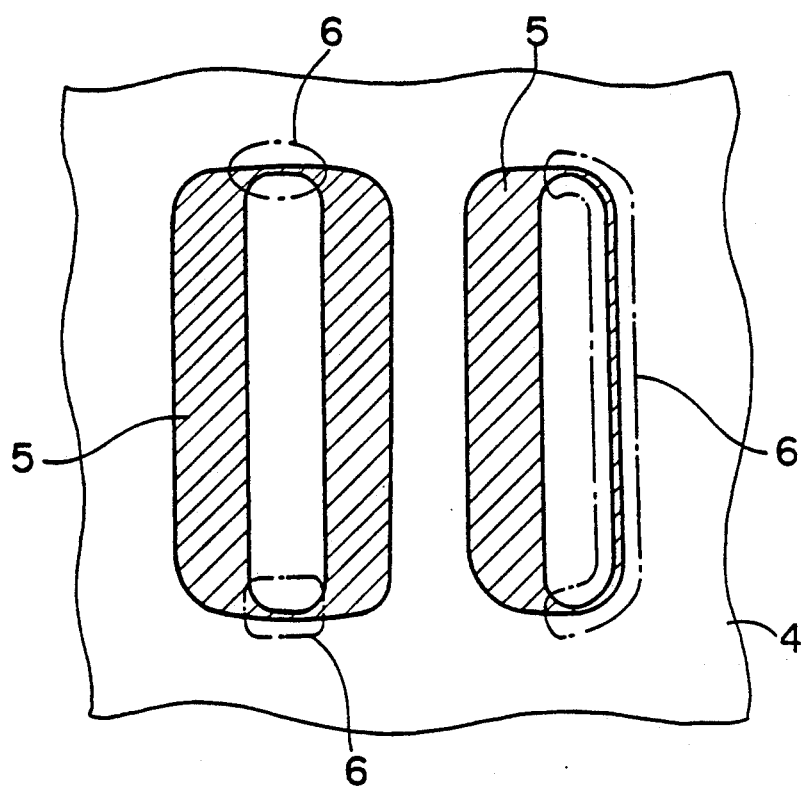
FIG. 24 is a diagram for explaining the drawback of the prior art photomask.

With the photomask 10, in the lines where the light-blocking regions 2 are disposed, the first and second phase regions 15 and 16 are alternately disposed with the light-blocking regions 2 interposing between them, as shown in FIG. 2A. Thus, the lights transmitted by the regions adjacent to each side of the light-blocking region 2 are out of phase by 180°, and a high resolution can be attained according to the theory of phase shift explained in conjunction with FIG. 22. FIG. 2B is a distribution diagram of the intensity of light corresponding to the regions in section of FIG. 2A. As can be seen from FIG. 2A, the resolution is especially enhanced at the edges of the light-blocking regions 2.

Figure 3B:
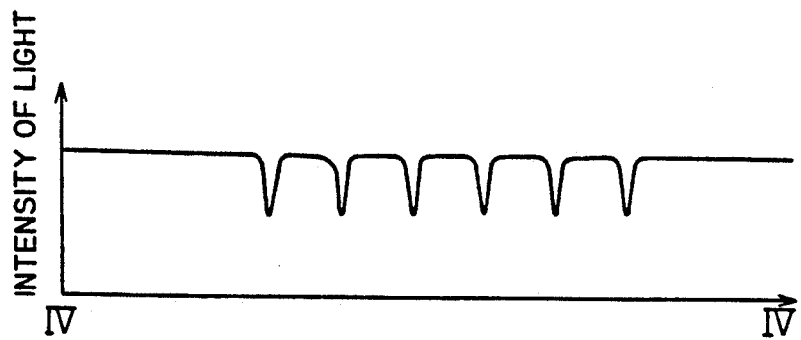
FIG. 3B is a distribution diagram of the intensity of light corresponding to regions in section of FIG. 3A.

With regard to the lines where no light-blocking region 2 is disposed, note the boundaries separating the first and third phase regions 15 and 17 and the second and third phase regions 16 and 17, as shown in FIG. 3A. The lights transmitted by the regions on each side of the separating boundary are out of phase by 90°. Thus, in the boundary, the intensity of light is reduced into half according to the theory previously mentioned. FIG. 3B is a distribution diagram of the intensity of light corresponding to the regions in section of FIG. 3A. FIG. 2B also shows the intensity of light corresponding to such a boundary. As will be recognized, since the intensity of light is reduced but not get naught in the boundaries, the boundaries function substantially like the transparent regions upon the pattern transference. Thus, when the photoresist layer on the processed substrate is of positive-type, the resist can be prevented from being left in the areas corresponding to the above-mentioned boundaries. On the other hand, when the photoresist is of negative-type, the resist in the areas corresponding to the boundaries can be prevented from being removed.

In this way, in spite of forming the light-blocking regions 2 like isolated islands, the mask pattern can be transferred with high resolution.

Figure 6:
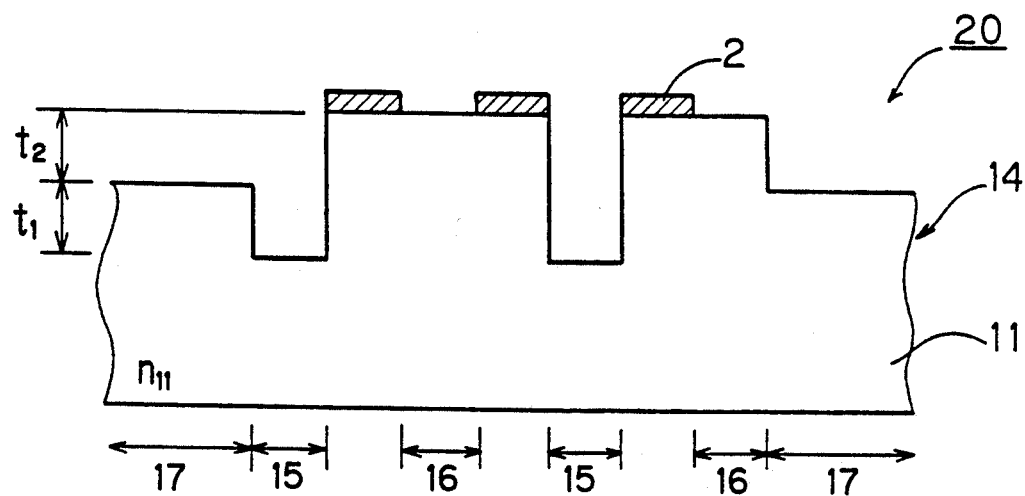
FIGS. 6 and 7 are sectional views of photomasks of a second embodiment according to the present invention.
Figure 7:
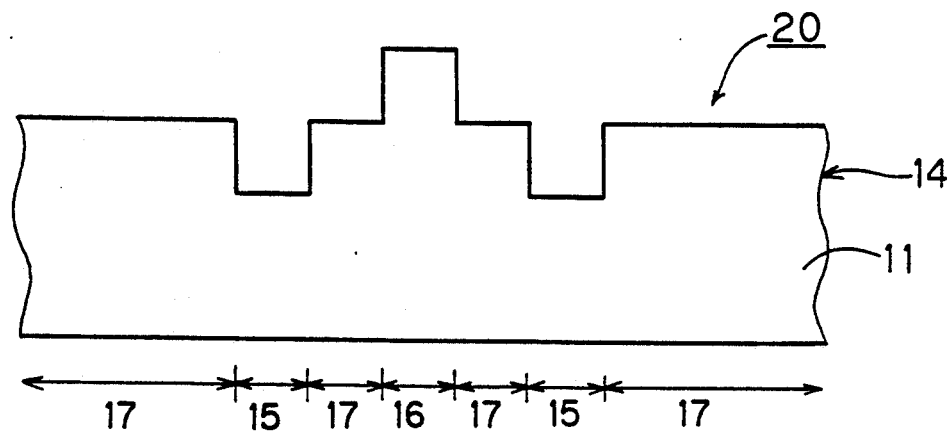

FIGS. 6 and 7 are sectional views showing photomasks of a second embodiment according to the present invention; FIG. 6 is a view along the line III—III of FIG. 1, while FIG. 7 is a view along the line IV—IV of FIG. 1.

A photomask 20 has a matrix arrangement of light-blocking regions 2 on a transparent member 14 consisting of a single transparent substrate 11. It is arranged that the first through third phase regions 15 through 17 have the same relations in phase as in the first embodiment shown in FIGS. 1 through 3 by varying the thickness of the transparent substrate 11. Specifically, it is arranged that the thickness of the transparent substrate 11 becomes smaller as it goes from the second phase region 16 to the third phase region 17 and further to the first phase region 15. The difference $t_1$ in thickness between the third and first phase regions 17 and 15 are determined so that the phase difference between the lights transmitted by the first and third phase regions 15 and 17 is +90°. For example, $t_1$ is obtained as follows:

$$t_1 = \frac{\lambda}{4(n_{11} - 1)} \quad (4)$$

where the refractive index of the transparent substrate 11 is $n_{11}$. Similarly, the difference $t_2$ in thickness between the second and third phase regions 16 and 17 is determined so that the phase difference between the lights transmitted by the third and second phase regions 17 and 16 is +90°. For example, $t_2$ is obtained as follows:

$$t_2 = t_1 = \frac{\lambda}{4(n_{11} - 1)} \quad (5)$$

The other parts are the same as in the first embodiment, and hence, like reference numerals denote corresponding parts of these embodiments to omit the explanation about them. With the photomask 20, the same effect as in the first embodiment can be produced.

Figure 8:
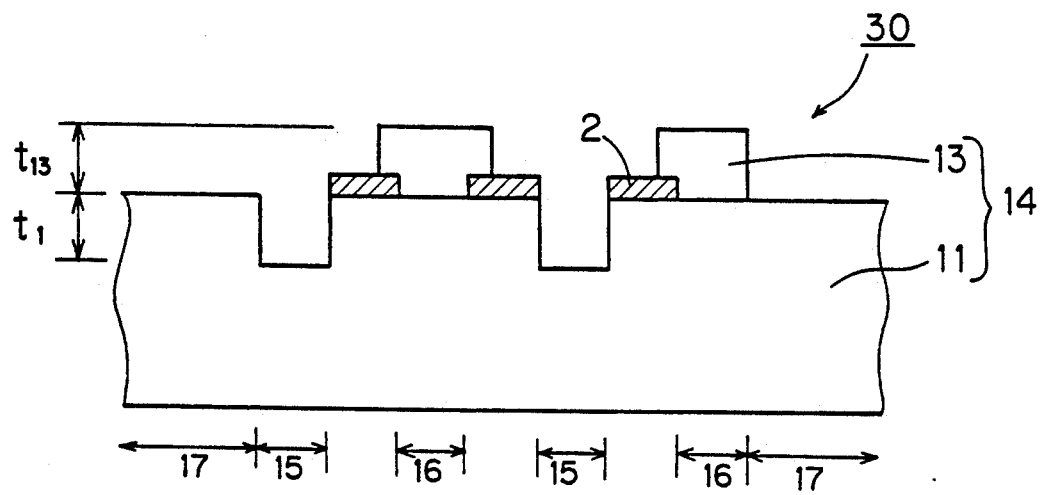
FIGS. 8 and 9 are sectional views of photomasks of a third embodiment according to the present invention.
Figure 9:
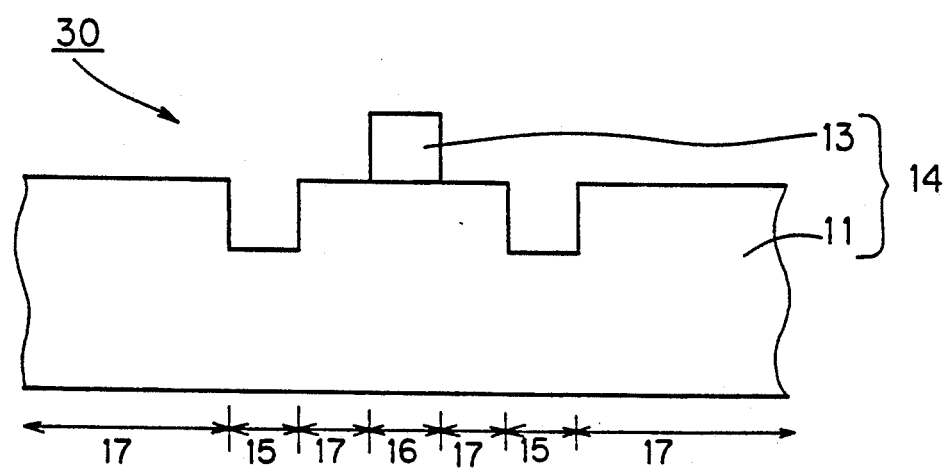

FIGS. 8 and 9 are sectional views showing a photomask of a third embodiment according to the present invention; FIG. 8 is a view taken along the line III—III of FIG. 1, while FIG. 9 is a view taken along the line IV—IV of FIG. 1.

In the photomask 30, a transparent member 14 is composed of a transparent substrate 11 and a phase film 13 formed on the transparent substrate 11, and a matrix arrangement of light-blocking regions 2 is provided on the transparent substrate 11. In this case, the phase difference between first and third phase regions 15 and 17 is determined by varying the thickness of the transparent substrate 11, while the phase difference between second and third phase regions 16 and 17 is determined by providing a phase film 13. Specifically, it is arranged that the first phase region 15 should be smaller in thickness than the third phase region 17; in this case, the difference $t_1$ in thickness between them is determined by the above-mentioned formula (4). The thickness $t_{13}$ of the phase film 13 is determined by the above-mentioned formula (2). Thus, it is arranged that the first through third phase regions 15 through 17 have the same relations in phase as in the first embodiment.

Other parts are the same as in the first embodiment, and hence, like reference numerals denote the corresponding parts of these embodiments to omit the explanation about them. Also with the photomask 30, the same effect as in the first embodiment is produced.

Figure 10:
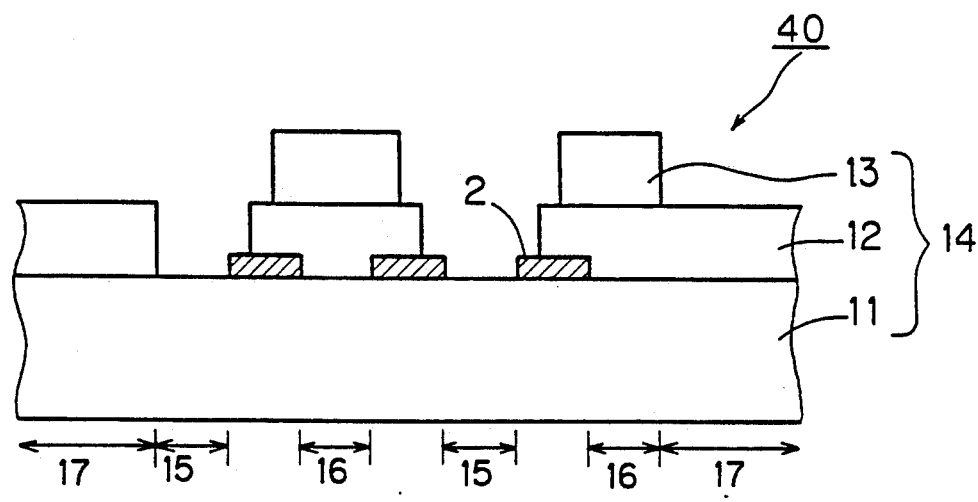
FIGS. 10 and 11 are sectional views of photomasks of a fourth embodiment according to the present invention.
Figure 11:
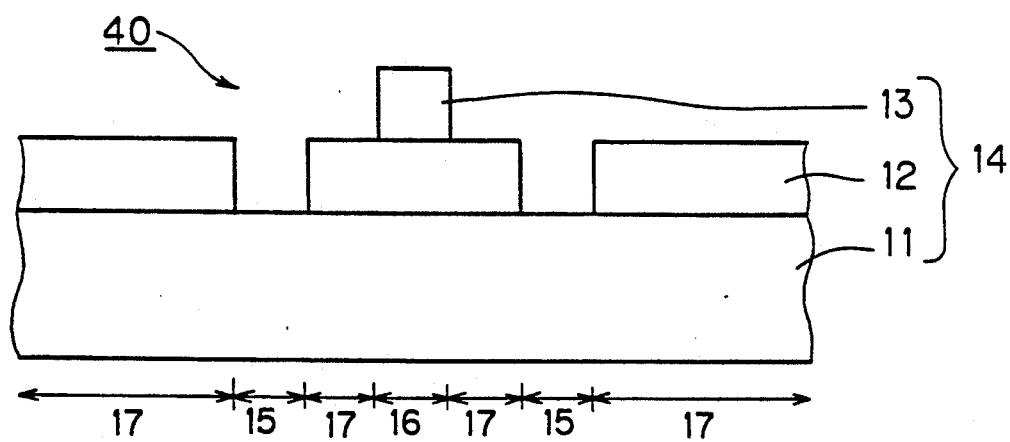

FIGS. 10 and 11 are sectional views showing a photomask of a fourth embodiment according to the present invention; FIG. 10 is a view taken along the line III—III of FIG. 1, while FIG. 11 is a view taken along the line IV—IV of FIG. 1.

In the photomask 40, light-blocking regions 2 are formed not on a second phase film 13 but on a transparent substrate 11. Other parts are the same as in the first embodiment shown in FIGS. 1 through 3, and they produce the same effect.

The material of the phase films 12, 13 in the first, third and fourth embodiments may include $SiO_2$, $Si_3N_4$ as well as inorganic material such as $CaF_2$ or organic material such as poly methyl methacrylate. These phase films may be multi-layer films made of a combination of materials as mentioned above.

In the first through fourth embodiments, the first phase region 15 is formed in concavity, while the second phase region 16 is formed in convexity; but both the phase regions 15, 16 may be formed in either way so long as they are of shapes reverse to each other.

In the first through fourth embodiments, the relations in phase among the first through third phase regions 15 through 17, are arranged that the phase difference between the lights transmitted by the first and second phase regions 15 and 16 is 180°, while the phase difference either between the lights transmitted by the first and third phase regions 15 and 17 or between the lights transmitted by the second and third phase regions 16 and 17 is 90°; however, the relations in phase may be arranged as follows: the relations in phase between the first and second phase regions 15 and 16 are arranged that the lights transmitted by the first and second phase regions 15 and 16 have a phase difference enough to cancel with each other because of the interference (i.e., a phase difference of 90°–270°), and also, the relations in phase of the third phase region 17 to the first and second phase regions 15 and 16 may be arranged that the phase difference between the lights transmitted by the first and third phase regions 15 and 17 and the phase difference between the lights transmitted by the second and third phase regions 16 and 17 are about a half of the phase difference between the lights transmitted by the first and second phase regions 15 and 16. Desirably, the relations in phase among the first through third phase regions 15 through 17, are established as in the first through fourth embodiments so as to attain the highest resolution.

Figure 12:
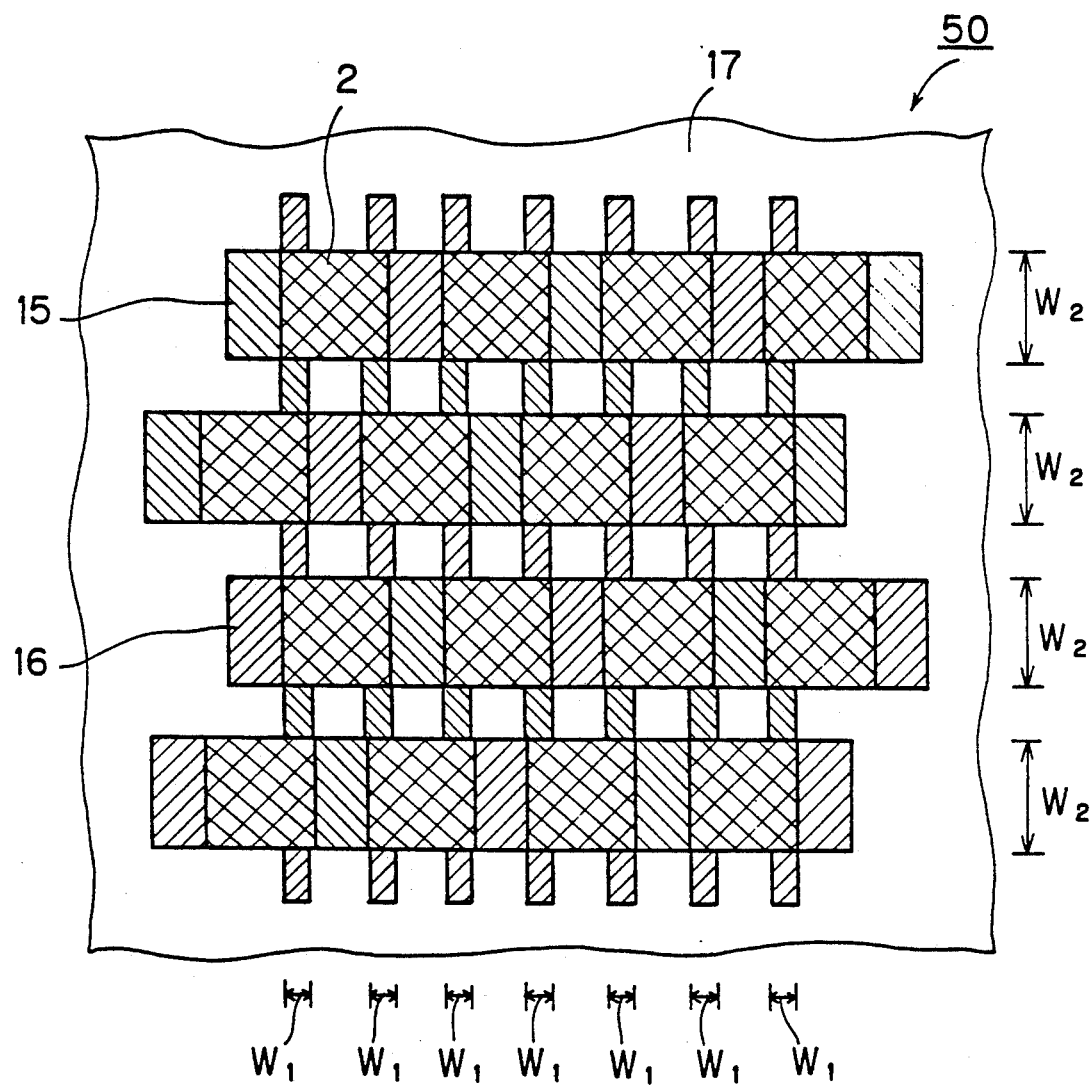
FIG. 12 is a plan view of a photomask of a fifth embodiment according to the present invention.

FIG. 12 is a plan view showing a photomask of a fifth embodiment according to the present invention.

In the photomask 50, light-blocking regions 2 are arranged in arrays in the row-direction and in zig-zag disposition in the column-direction. First and second phase regions 15 and 16 are alternately formed within a section $W_1$ in which the light-blocking regions 2 adjacent to each other in the column-direction overlap with each other in the row-direction. Similarly, the first and second phase regions 15 and 16 are alternately formed within a section $W_2$ in which the light-blocking regions 2 adjacent to each other in the row-direction overlap with each other in the column-direction. Other parts are the same as in the above-mentioned embodiments, and they produce the same effect.

Although, in the above-mentioned embodiments, the case where the light-blocking regions 2 are arranged in parallel in the two, row- and column-, directions, the present invention can be also applied to the case where the light-blocking regions 2 are arranged in parallel in either direction.

Then, methods of manufacturing the above-mentioned photomasks will be described.

FIGS. 13A through 13L and FIGS. 14A through 14L are sectional views showing a process of manufacturing the photomask 10 of the first embodiment shown in FIGS. 1 through 3; FIGS. 13A through 13L show sections taken along the line III—III of FIG. 1, while FIGS. 14A through 14L show sections taken along the line IV—IV of FIG. 1.

Figure 13A:
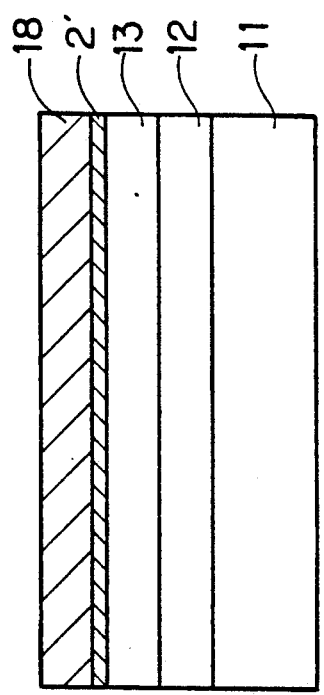
FIG. 13A through 13L and FIGS. 14A through 14L are sectional views showing steps of manufacturing the photomask of the above-mentioned first embodiment.
Figure 14A:
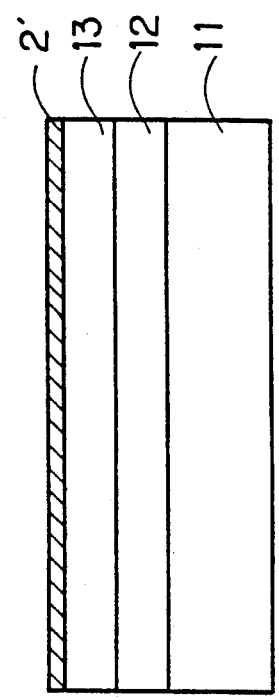

First, as shown in FIGS. 13A and 14A, the first phase film 12 of $Si_3N_4$, the second phase film 13 of $SiO_2$ and a light-blocking film 2' of CF are formed on the transparent substrate 11 in this order. (The 1st Step) In this case, the thickness $t_{12}$ of the first phase film 12 and the thickness $t_{13}$ of the second phase film 13 are determined, for example, as expressed by the formulae (1) and (2).

Figure 13B:
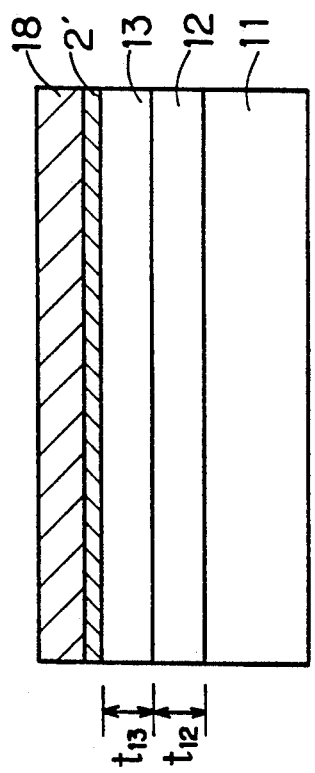
Figure 14B:
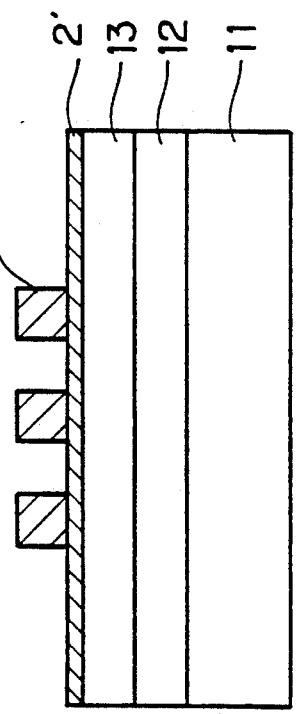
Figure 14C:
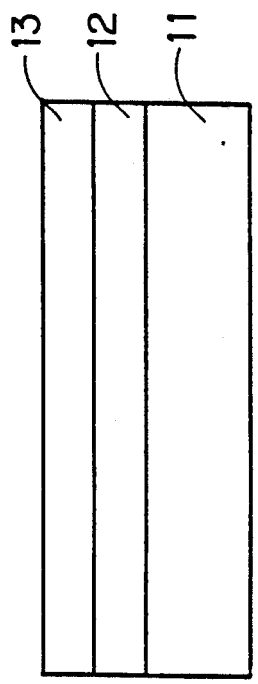
Figure 14D:
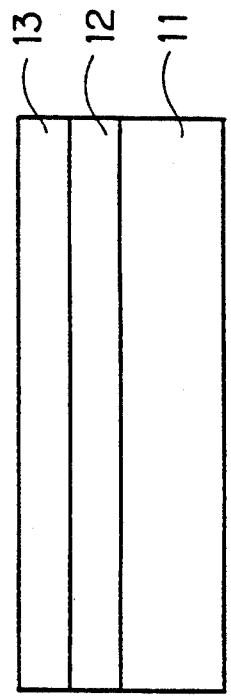
Figure 13C:
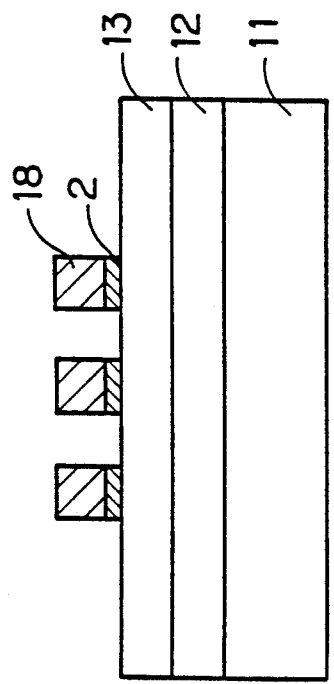
Figure 13D:
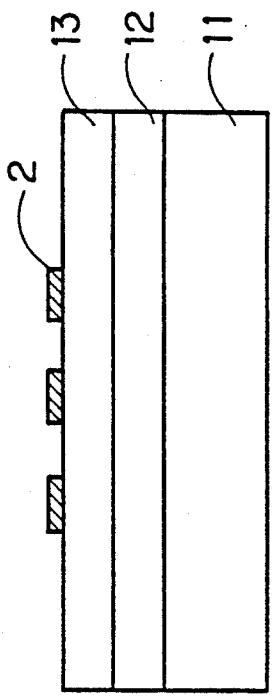

Then, the resist layer 18 is formed on the light-blocking film 2', and the resist layer 18 is, as shown in FIGS. 13B and 14B, selectively removed by an electron beam exposing method to create a pattern of the resist layer 18 in agreement with the light-blocking pattern. Then, as shown in FIGS. 13C and 14C, after the light-blocking film 2' is selectively removed by etching with a mask of the resist layer 18, the resist layer 18 is removed, as shown in FIGS. 13D and 14D, to form the light-blocking regions 2 arranged in parallel. (The 2nd Step)

Figure 13E:
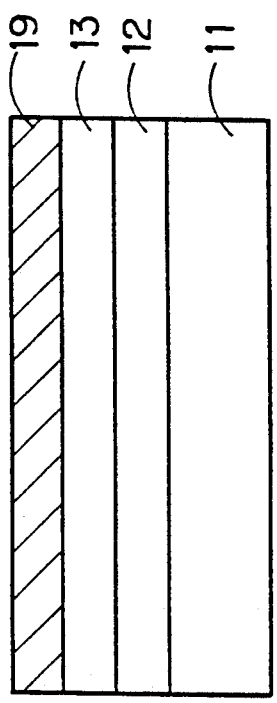
Figure 13F:
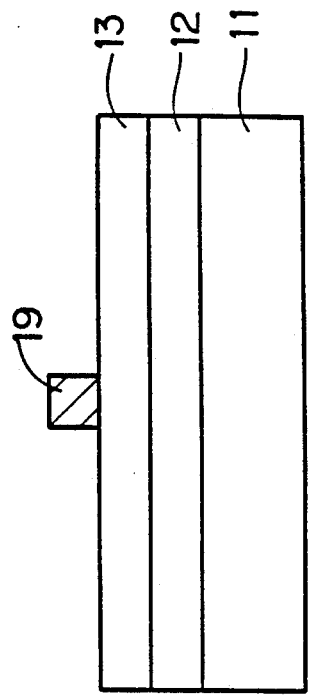
Figure 14E:
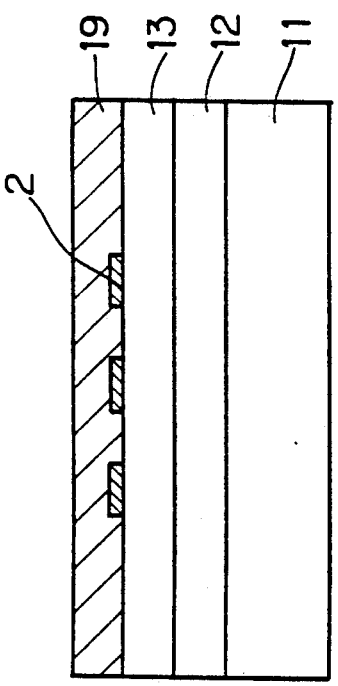
Figure 14F:
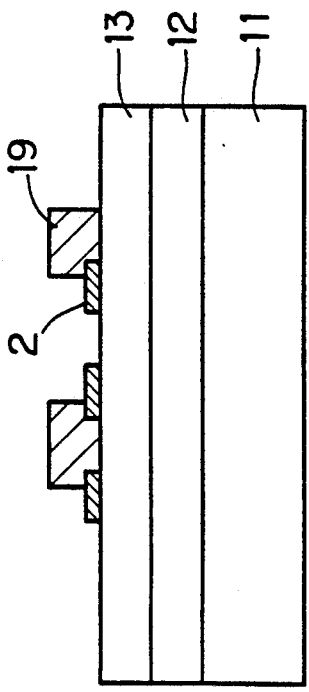
Figure 13G:
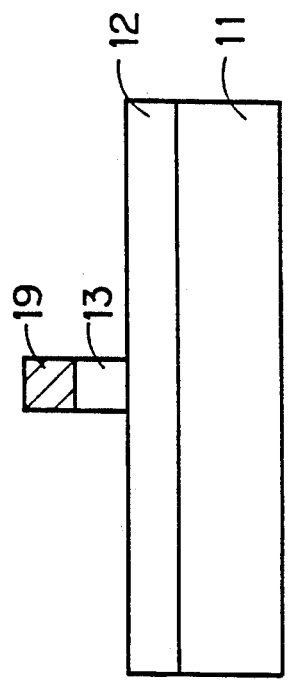
Figure 13H:
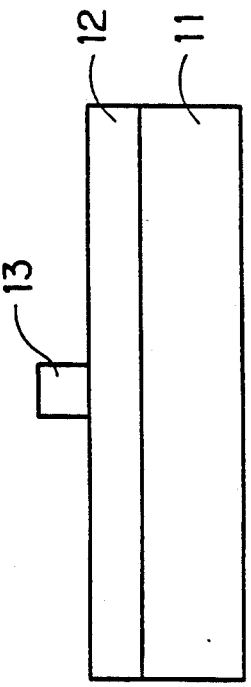
Figure 14G:
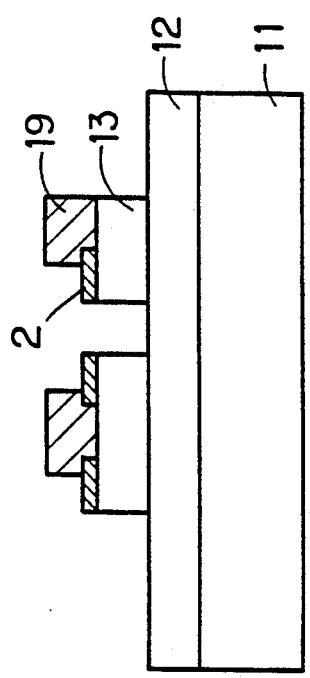
Figure 14H:
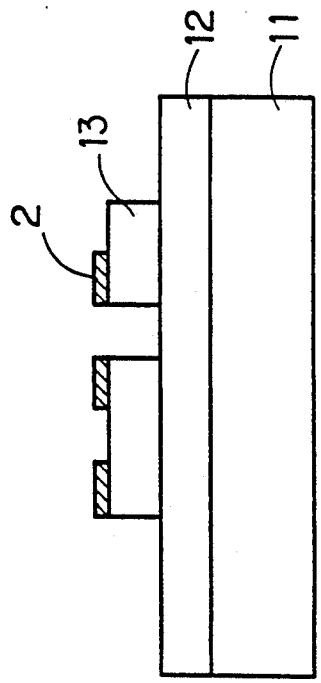

Thereafter, as shown in FIGS. 13E and 14E, the resist layer 19 is formed on the light-blocking regions 2 and the second phase film 13. Then, as shown in FIGS. 13F and 14F, the resist layer 19 is selectively removed by an electron beam exposing method to create a pattern of the resist layer 19 in agreement with the pattern of the second phase region 16. After that, as shown in FIGS. 13G and 14G, the second phase film 13 is selectively removed by etching with masks of the resist layer 19 and the light-blocking regions 2. In this way, the areas in the second phase film 13 corresponding to the first and third phase regions 15 and 17 are selectively removed. After that, the resist layer 19 is removed to obtain a chip shown in FIGS. 13H and 14H. (The 3rd Step)

Figure 13I:
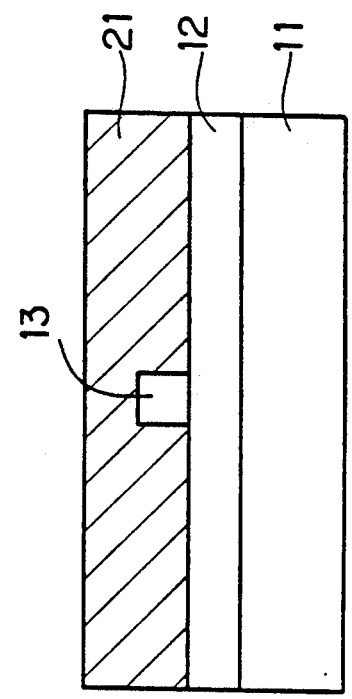
Figure 13J:
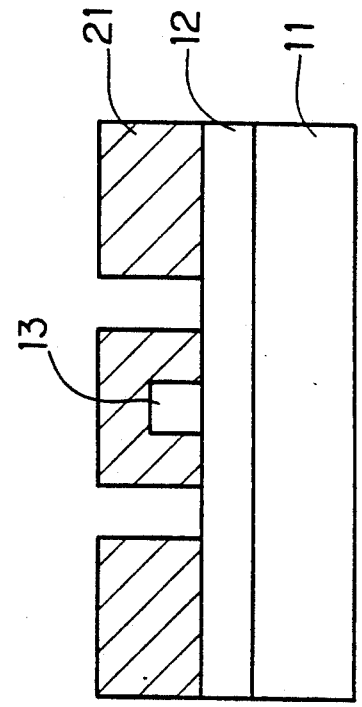
Figure 14I:
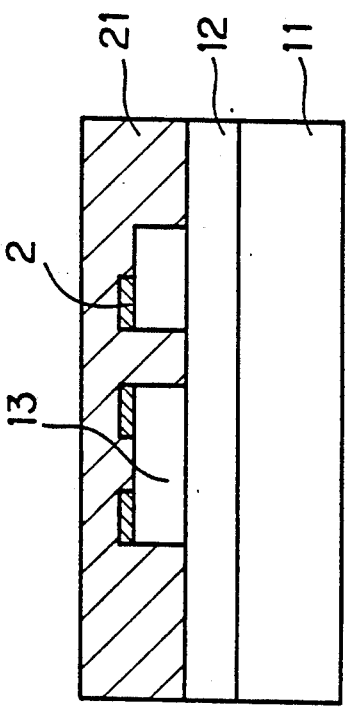
Figure 14J:
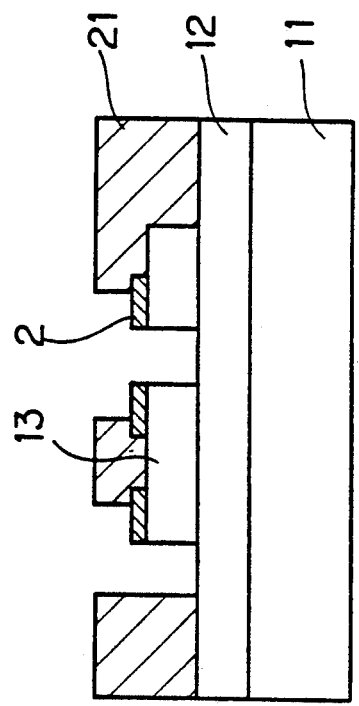
Figure 13K:
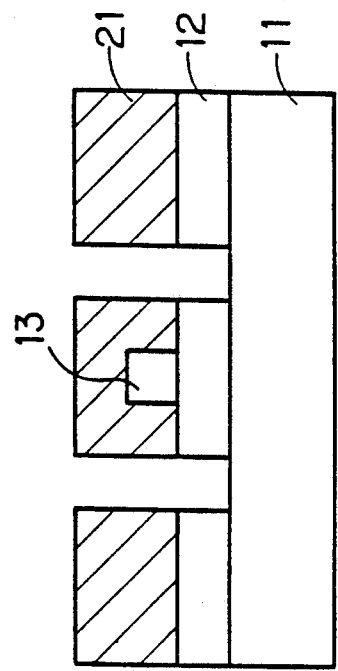
Figure 13L:
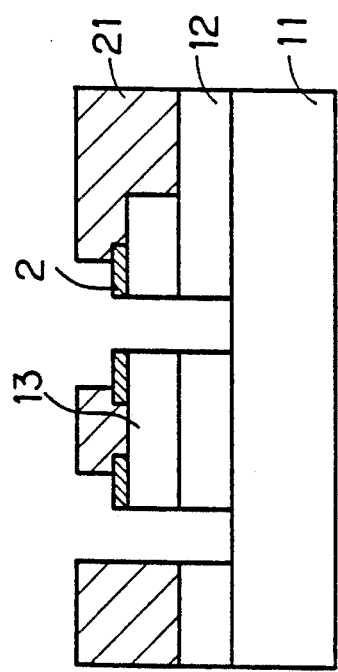
Figure 14K:
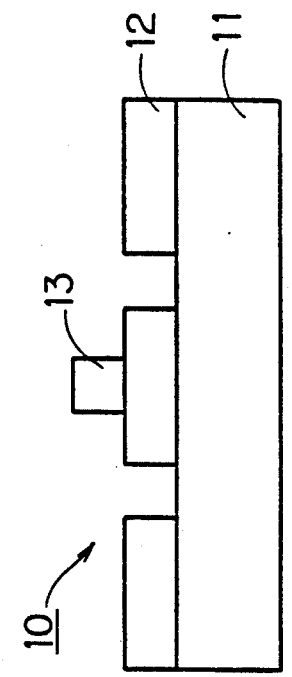
Figure 14L:
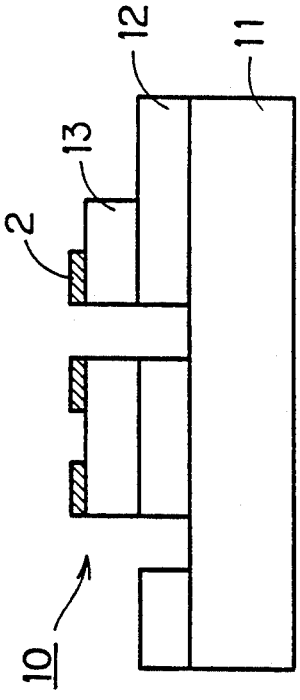

Then, as shown in FIGS. 13I and 14I, the resist layer 21 is formed on the light-blocking regions 2 and the second and first phase films 13 and 12. Then, as shown in FIGS. 13J and 14J, the resist layer 21 is selectively removed by an electron beam exposing method to create a pattern of the resist layer 21 in agreement with the patterns of the second and third phase regions 16 and 17. After that, as shown in FIGS. 13K and 14K, the first phase film 12 is selectively removed with masks of the resist layer 21 and the light-blocking regions 2. In this way, the areas in the first phase film 12 corresponding to the first phase region 15 are selectively removed. Eventually, removing the resist layer 21, the photomask 10 as shown in FIGS. 13L and 14L is obtained. (The 4th Step)

FIGS. 15A through 15L and FIGS. 16A through 16L are sectional views showing a process of manufacturing the photomask 20 of the second embodiment shown in FIGS. 6 and 7; FIGS. 15A through 15L are sections taken along the line III—III of FIG. 1, while FIGS. 16A through 16L are sections taken along the line IV'IV of FIG. 1.

Figure 15A:
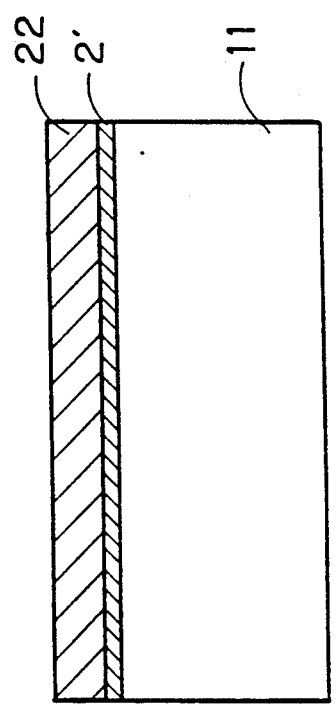
Figure 16A:
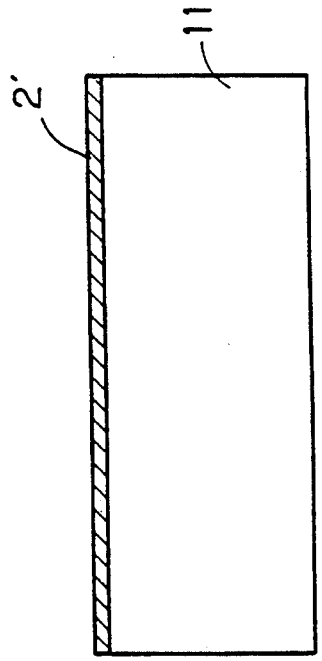

First, as shown in FIGS. 15A and 16A, the light-blocking film 2' of Cr is formed on the transparent substrate 11 of $SiO_2$, for example. (The 1st Step)

Figure 15B:
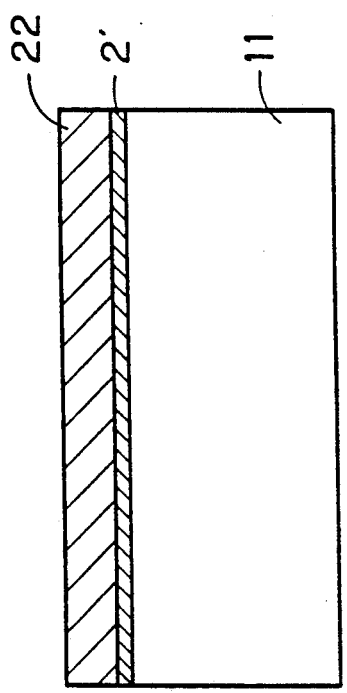
Figure 16B:
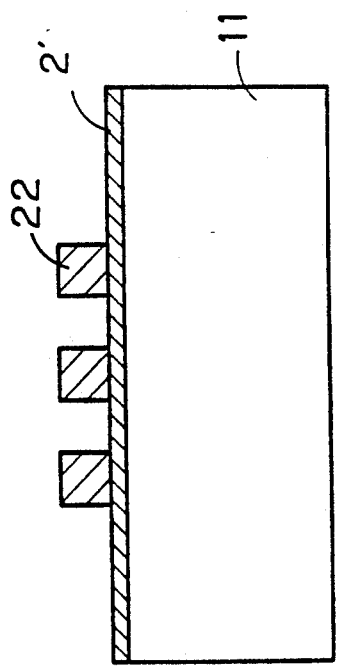
Figure 16C:
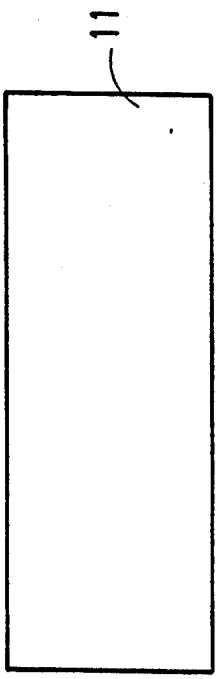
Figure 16D:
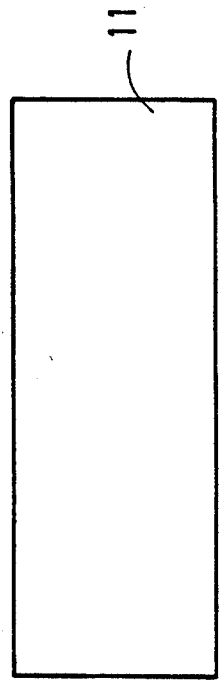
Figure 15C:
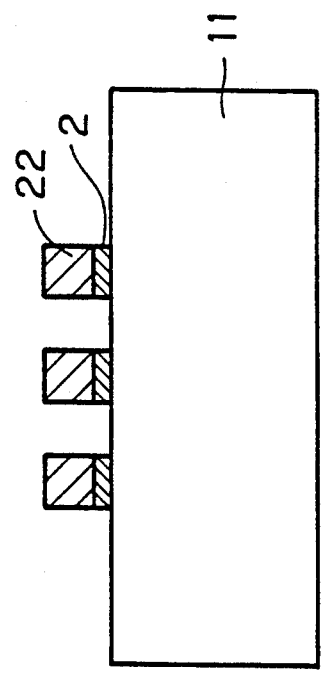
Figure 15D:
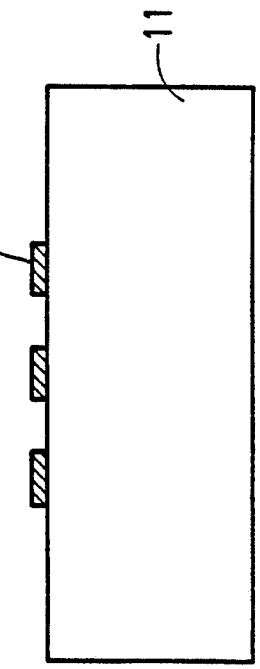

Then, the resist layer 22 is formed on the light-blocking film 2', and then, the resist layer 22 is selectively removed by an electron beam exposing method, as shown in FIGS. 15B and 16B, to create a pattern of the resist layer 22 in agreement with the light-blocking pattern. Then, after the light-blocking film 2' is selectively removed by etching with a mask of the resist layer 22 as shown in FIGS. 15C and 16C, the resist layer 22 is removed, as shown in FIGS. 15D and 16D, to form the light-blocking regions 2 arranged in parallel. (The 2nd Step)

Figure 15E:
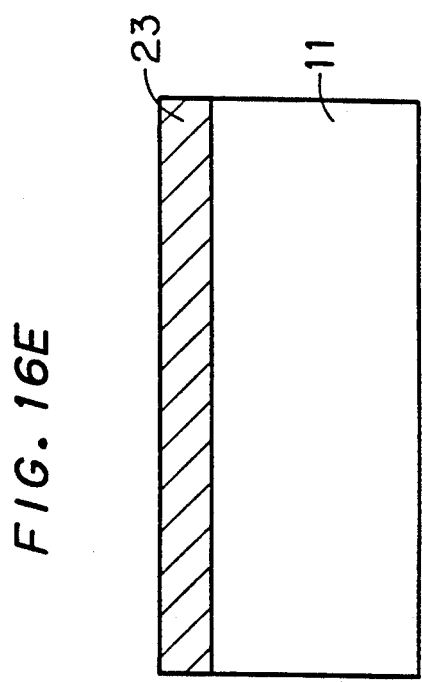
Figure 16E:
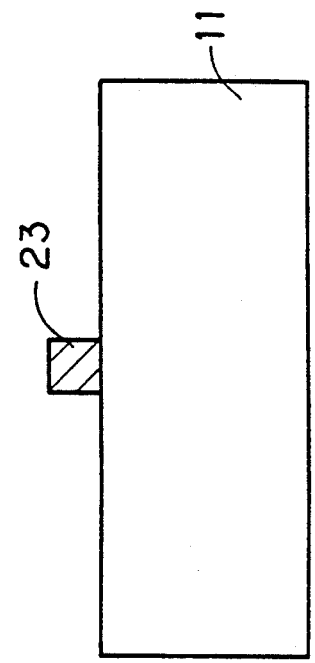
Figure 15F:
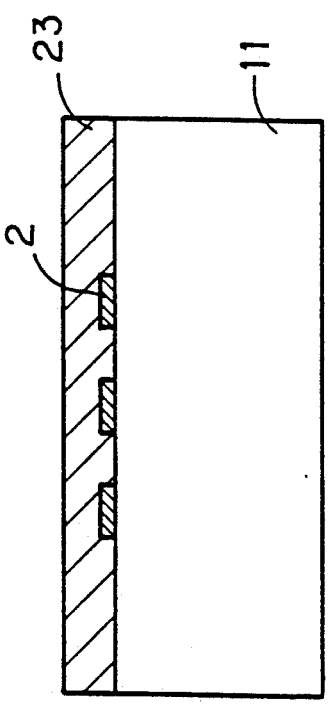
Figure 16F:
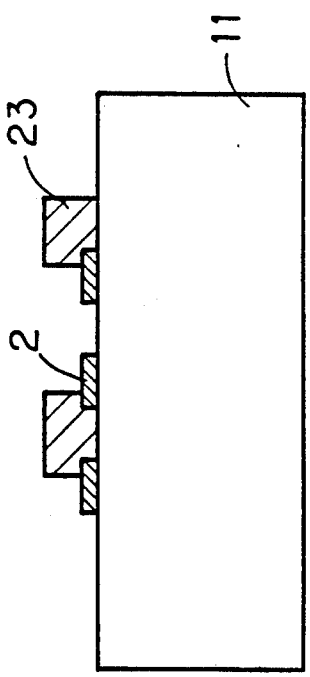
Figure 15G:
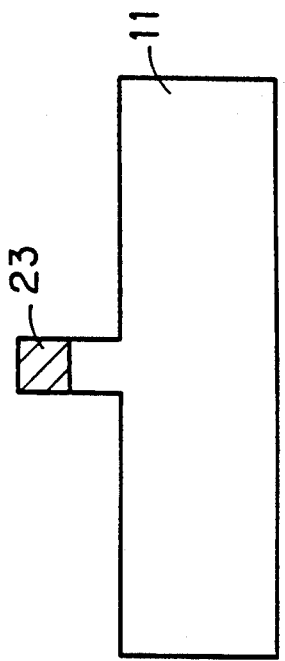
Figure 16G:
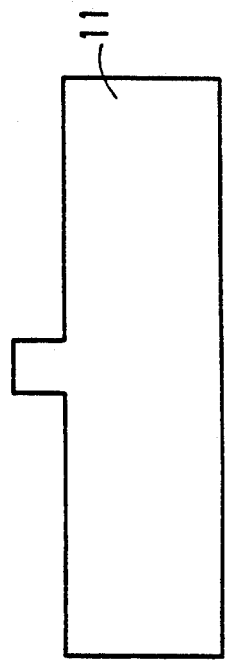
Figure 15H:
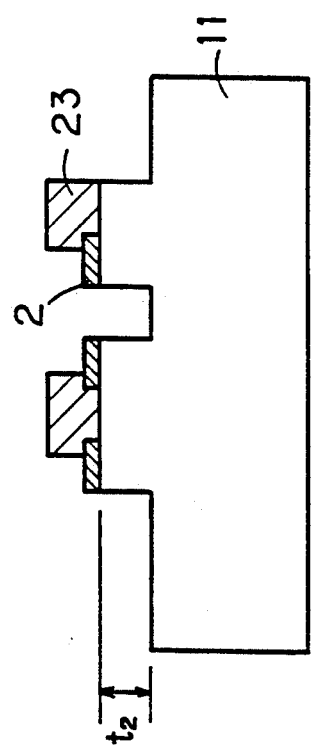
Figure 16H:
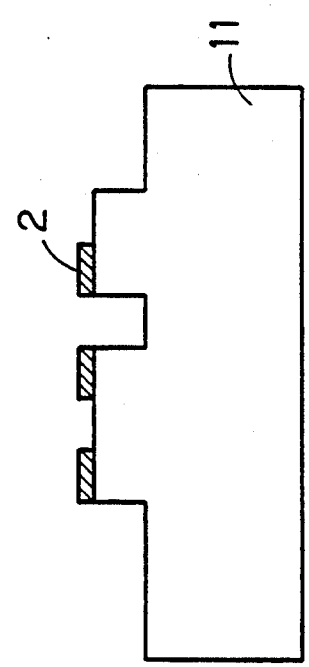

After that, as shown in FIGS. 15E and 16E, the resist layer 23 is formed on the light-blocking regions 2 and the transparent substrate 11. Then, after the resist layer 23 is selectively removed by an electron beam exposing method as shown in FIGS. 15F and 16F, a pattern of the resist layer 23 in agreement with the pattern of the second phase region 16 is obtained. After that, as shown in FIGS. 15G and 16G, an exposed region of the transparent substrate 11 is selectively removed by etching by a particular depth with masks of the resist layer 23 and the light-blocking regions 2. In this way, the areas in the transparent substrate 11 corresponding to the first and third phase regions 15 and 17 are selectively removed. In this case, the etching depth $t_2$ is determined as expressed by the formula (5). The etching depth is usually adjusted by controlling a period of time required for the etching. After that, the resist layer 23 is removed, and a chip shown in FIGS. 15H and 16H is obtained. (The 3rd Step)

Figure 15K:
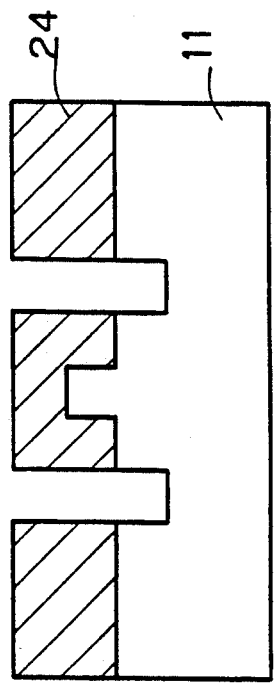
Figure 16K:
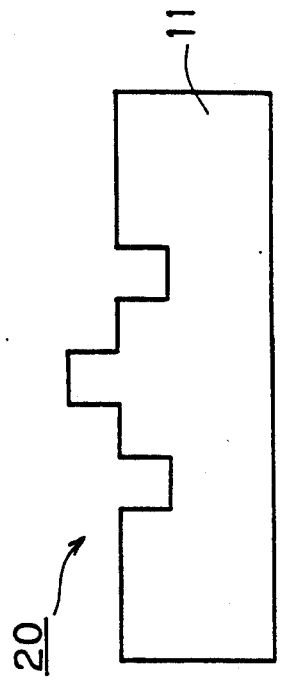
Figure 15L:
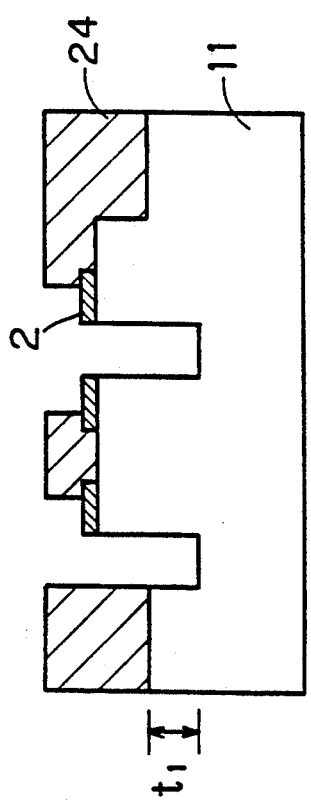
Figure 16L:
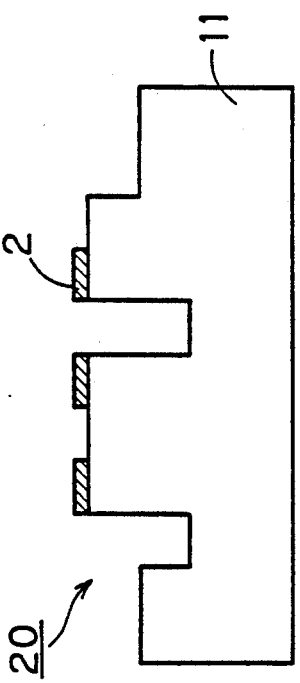
Figure 18A:
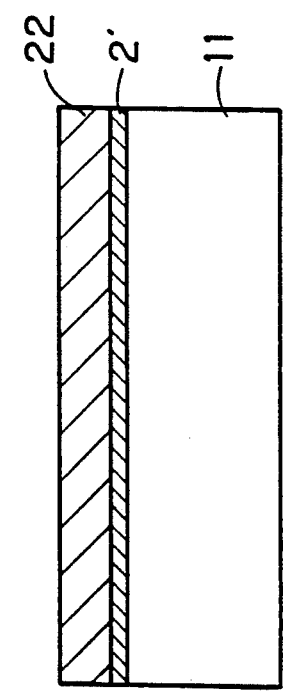
Figure 18B:
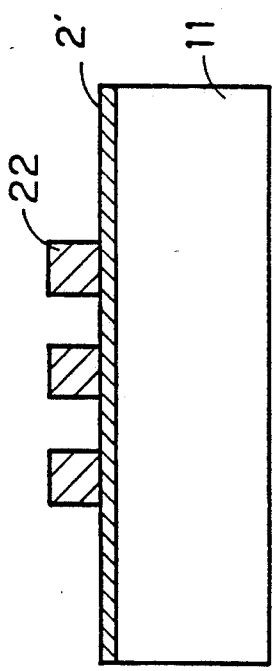

Then, as shown in FIGS. 15I and 16I, the resist layer 24 is formed on the light-blocking regions 2 and the exposed regions of the transparent substrate 11. Then, as shown in FIGS. 15J and 16J, the resist layer 24 is selectively removed by an electron beam exposing method to create a pattern of the resist layer 24 in agreement with the patterns of the second and third phase regions 16 and 17. After that, as shown in FIGS. 15K and 16K, the exposed region of the transparent substrate 11 is further selectively removed by etching with masks of the resist layer 24 and the light-blocking regions 2. In this way, the region in the transparent substrate 11 corresponding to the first phase region 15 is selectively removed. In this case, the etching depth $t_1$ is determined as expressed by the formula (4), for example. Eventually, removing the resist layer 24, the photomask 20 shown in FIGS. 15L and 16L is obtained. (The 4th Step)

FIGS. 17A through 17M and FIGS. 18A through 18M are sectional views showing steps of manufacturing the photomask 30 of the third embodiment shown in FIGS. 8 and 9; FIGS. 17A through 17M are sections taken along the line III—III of FIG. 1, while FIGS. 18A through 18M are sections taken along the line IV—IV of FIG. 1.

The first and second steps (FIGS. 17A through 17D and FIGS. 18A through 18D) are the same as the steps shown in FIGS. 15A through 15D and FIGS. 16A through 16D.

Figure 17A:
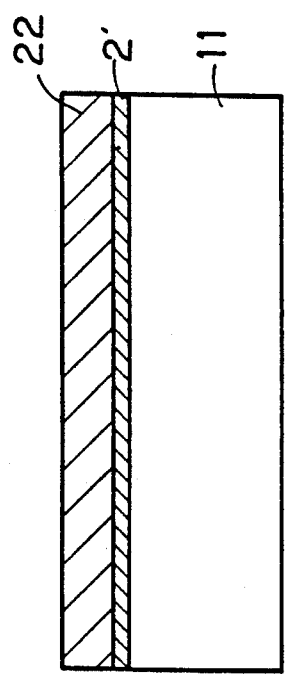
Figure 17B:
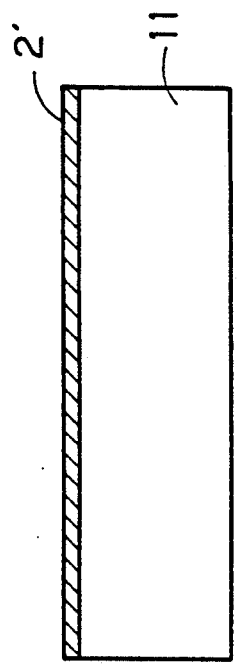
Figure 17E:
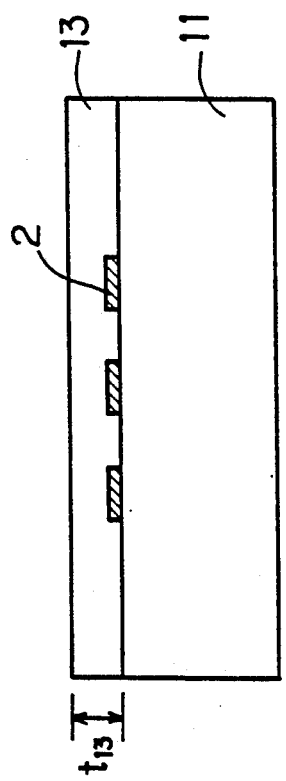
Figure 18E:
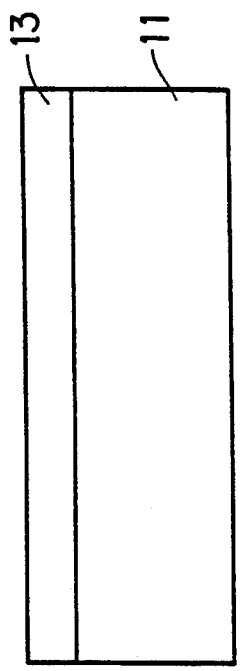

After that, as shown in FIGS. 17E and 18E, the phase film 13 made of, for example, $Si_3N_4$ is formed on the light-blocking regions 2 and the transparent substrate 11. In this case, the thickness $t_{13}$ of the phase film 13 is determined as expressed by the formula (2), for example.

Figure 17F:
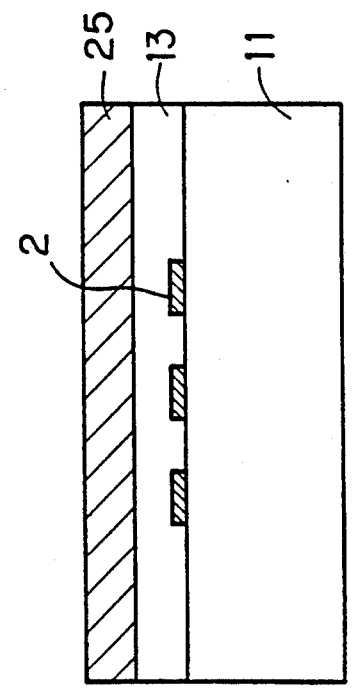
Figure 18F:
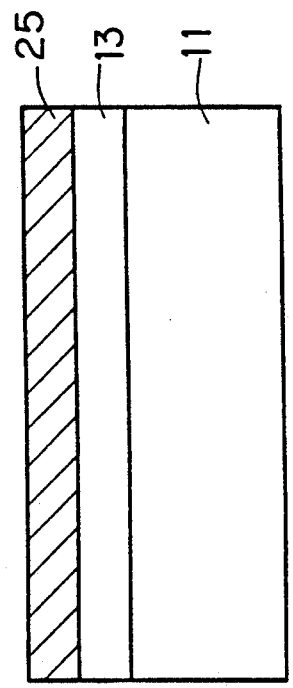
Figure 17G:
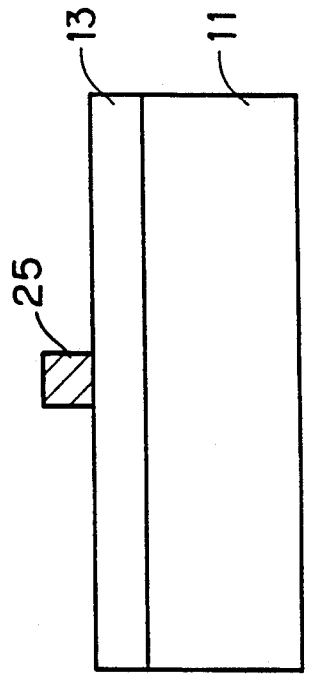
Figure 17H:
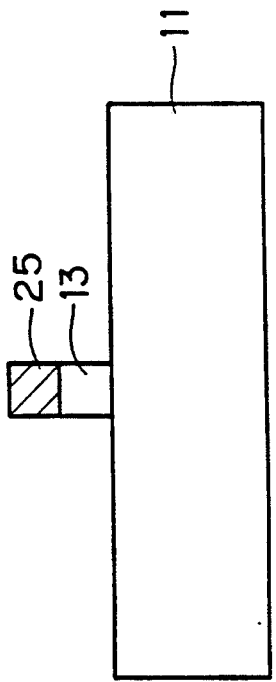
Figure 18G:
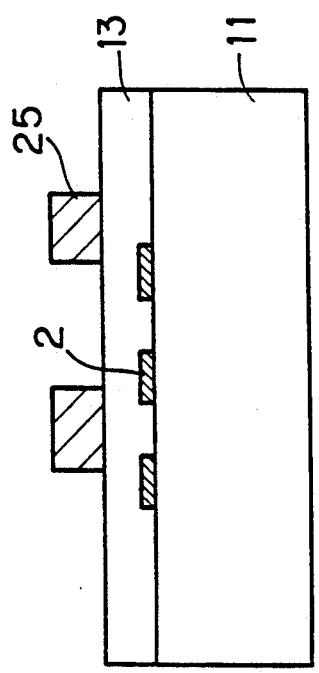
Figure 18H:
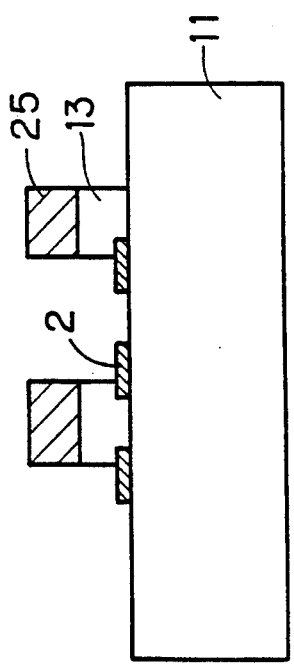
Figure 18I:
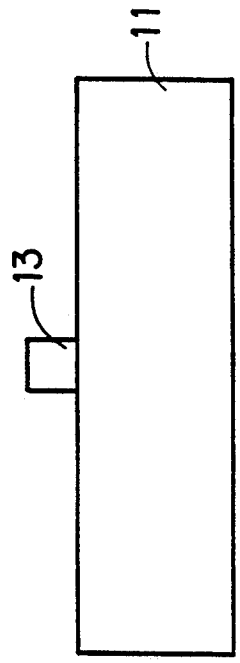

After that, as shown in FIGS. 17F and 18F, the resist layer 25 is formed on the phase film 13. Then, the resist layer 25 is electively removed by an electron beam exposing method as shown in FIGS. 17G and 18G, to create a pattern of the resist layer 25 in agreement with the pattern of the second phase region 16. Then, after the phase film 13 is selectively removed by etching with a mask of the resist layer 25 as shown in FIGS. 17H and 18H, the resist layer 25 is removed to create a chip shown in FIGS. 17I and 18I. (The 3rd Step) In this way, the phase film 13 is selectively formed on the region in the transparent substrate 11 corresponding to the second phase region 16.

Figure 18J:
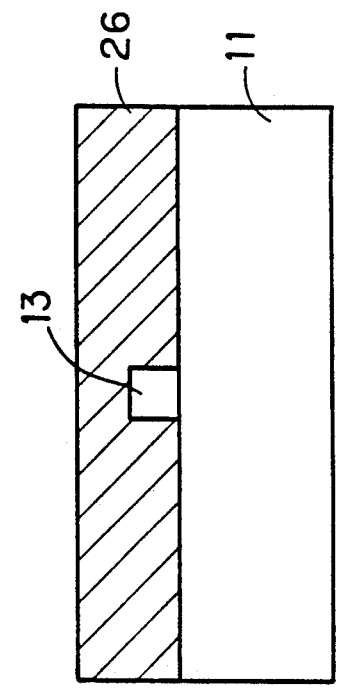
Figure 17I:
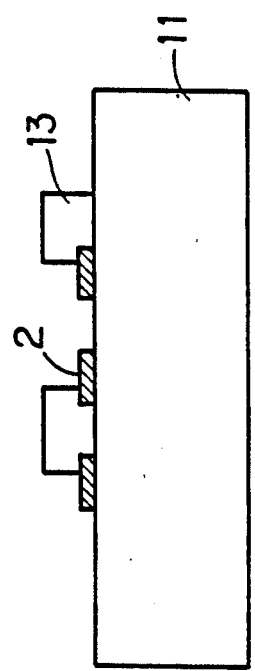
Figure 17J:
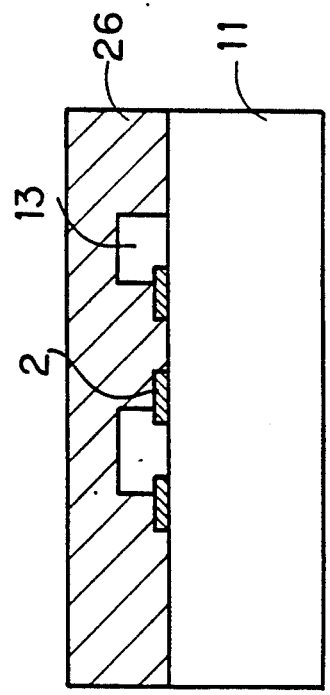
Figure 18K:
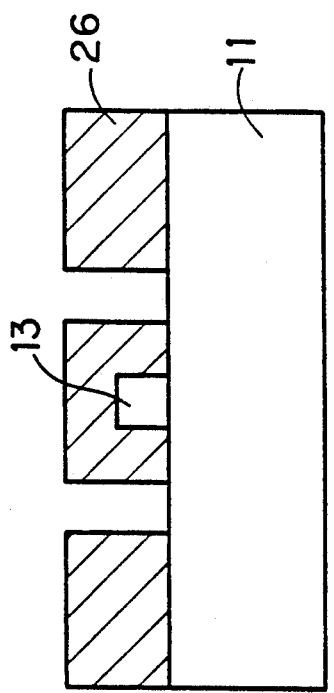
Figure 18L:
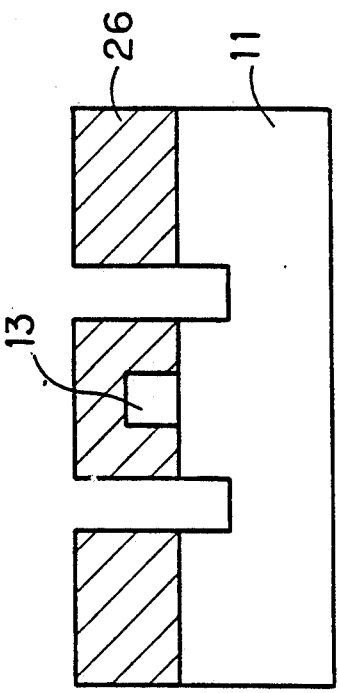
Figure 17K:
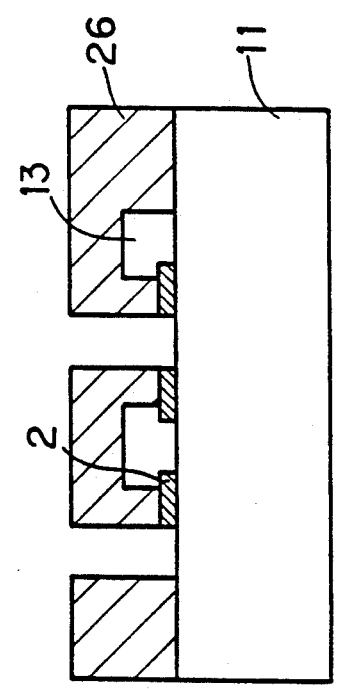
Figure 17L:
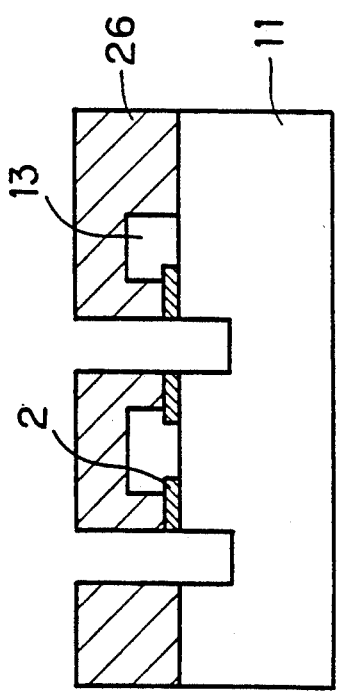
Figure 17M:
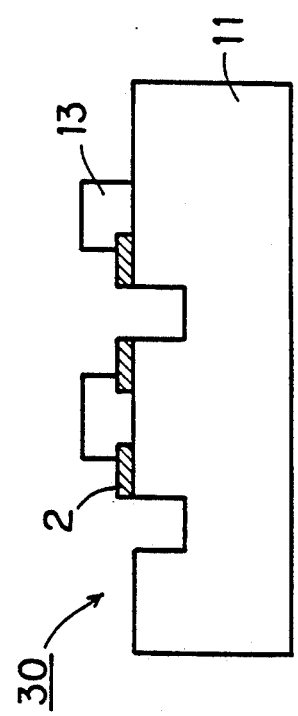
Figure 18M:
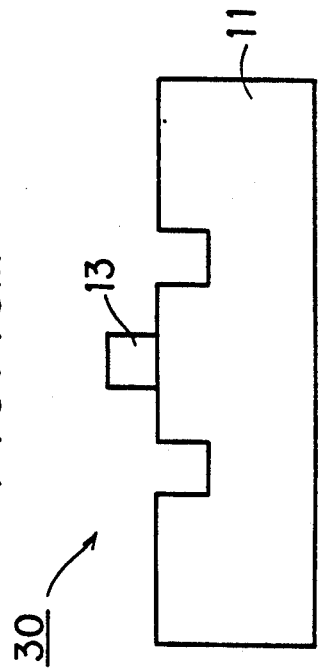

Then, as shown in FIGS. 17J and 18J, the resist layer 26 is formed on the phase film 13, the light-blocking regions 2 and the transparent substrate 11. Then, the resist layer 26 is selectively removed by an electron beam exposing method as shown in FIGS. 17K and 18K to create a pattern of the resist layer 26 in agreement with the patterns of the second and third phase regions 16 and 17. After that, as shown in FIGS. 17L and 18L, the exposed region of the transparent substrate 11 is selectively removed by etching by a particular depth with a mask of the resist layer 26. In this way, the region in the transparent substrate 11 corresponding to the first phase region 15 is selectively removed. In this case, the etching depth $t_1$ is determined as expressed by the formula (4), for example. Eventually, removing the resist layer 26, the photomask 30 shown in FIGS. 17M and 18M is obtained. (The 4th Step)

Figure 19A:
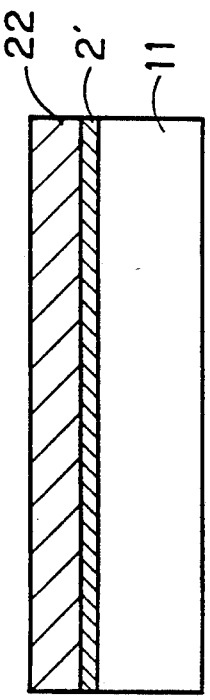
FIGS. 19A through 19N and FIGS. 20A through 20N are sectional views showing steps of manufacturing the photomask of the above-mentioned fourth embodiment.
Figure 20A:
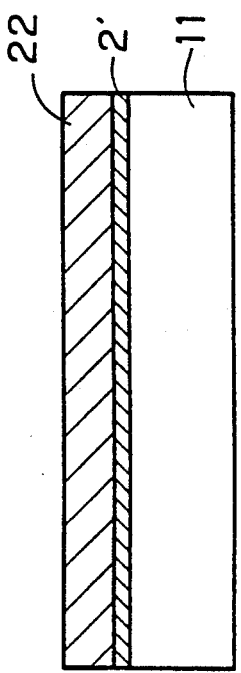
Figure 20B:
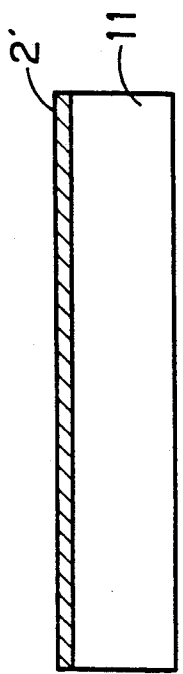
Figure 20C:
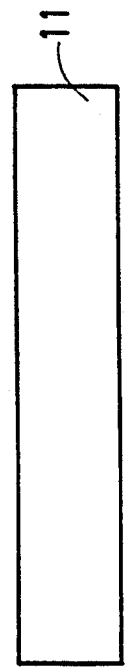
Figure 19B:
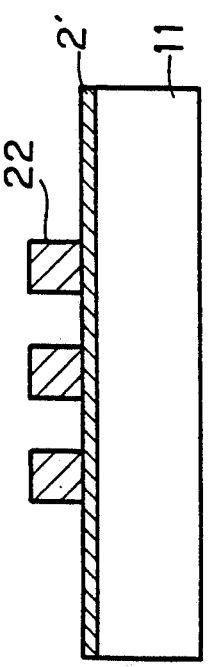
Figure 19C:
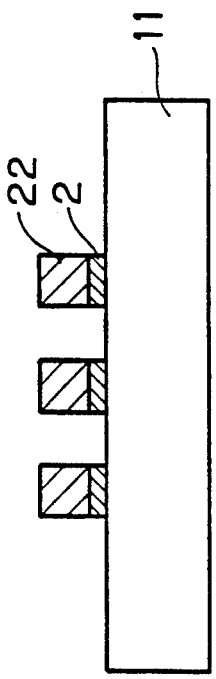
Figure 20D:

FIGS. 19A through 19N and FIGS. 20A through 20N are sectional views showing a process of manufacturing the photomask 40 of the fourth embodiment shown in FIGS. 10 and 11; FIGS. 19A through 19N are sections taken along the line III—III of FIG. 1, while FIGS. 20A through 20N are sections taken along the line IV—IV of FIG. 1.

The first and second steps (FIGS. 19A through 19D and FIGS. 20A through 20D) are the same as the steps shown in FIGS. 15A through 15D and FIGS. 16A through 16D.

Figure 20E:
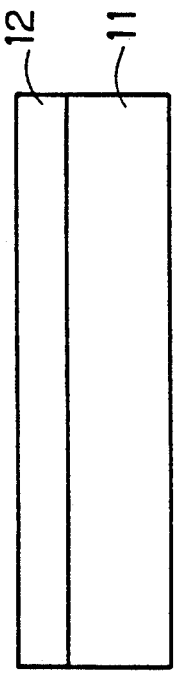
Figure 19D:
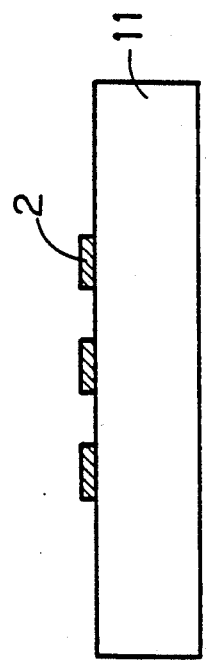
Figure 19E:
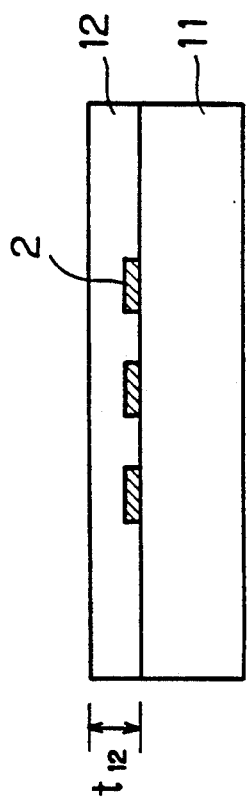

After that, as shown in FIGS. 19E and 20E, the first phase film 12 made of, for example, $Si_3N_4$ is formed on the light-blocking regions 2 and the transparent substrate 11. In this case, the thickness $t_{12}$ of the first phase film 12 is, for example, determined as expressed by the formula (1).

Figure 19F:
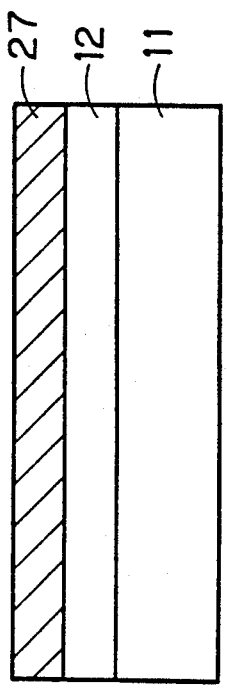
Figure 19G:
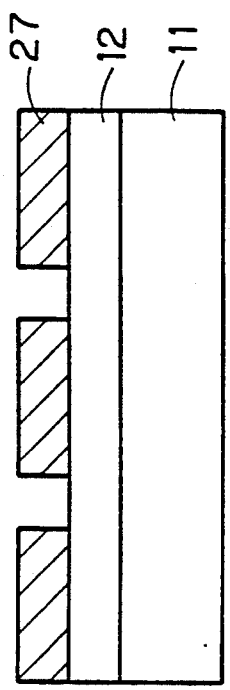
Figure 20F:
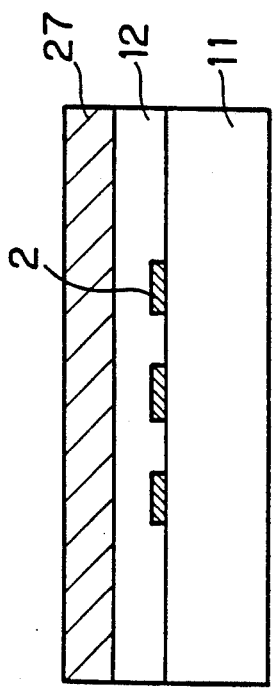
Figure 20G:
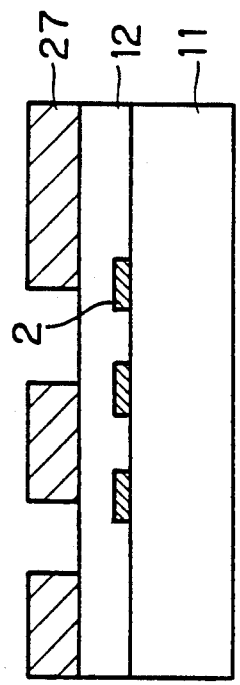
Figure 19H:
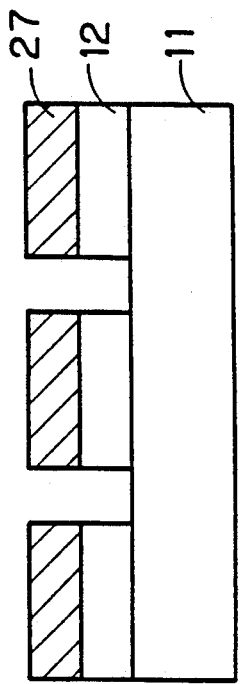
Figure 19I:
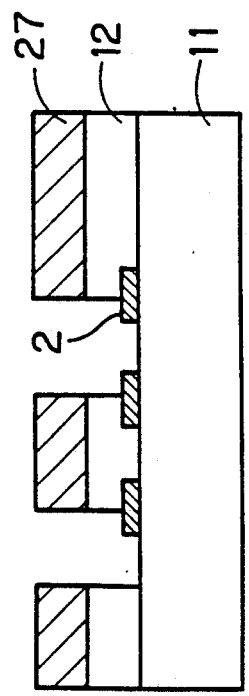
Figure 20H:
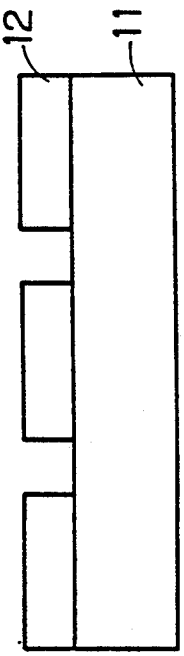
Figure 20I:
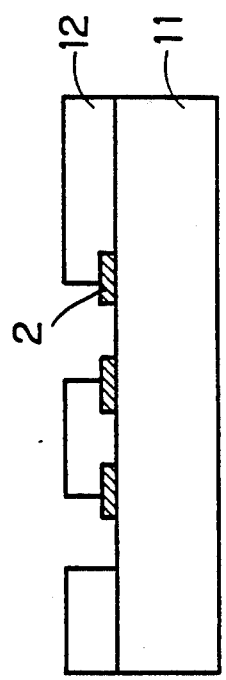

After that, as shown in FIGS. 19F and 20F, the resist layer 27 is formed on the first phase film 12. Then, the resist layer 27 is selectively removed by an electron beam exposing method as shown in FIGS. 19G and 20G, to create a pattern of the resist layer 27 in agreement with the patterns of the second and third phase regions 16 and 17. Then, after the first phase film 12 is selectively removed by etching with a mask of the resist layer 27 as shown in FIGS. 19H and 20H, the resist layer 27 is removed to make a chip shown in FIGS. 19I and 20I. (The 3rd Step) In this way, the first phase film 12 is selectively formed on the regions in the transparent substrate 11 corresponding to the second and third phase regions 16 and 17.

Figure 19J:
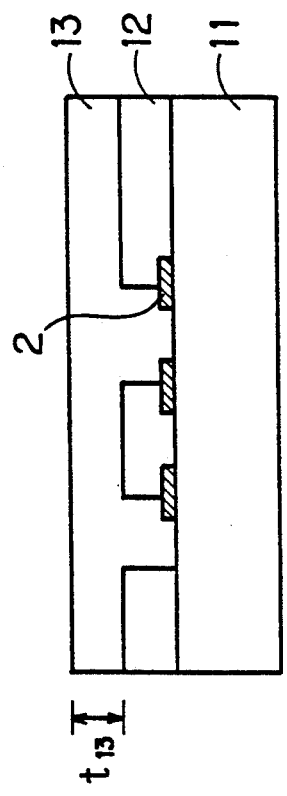
Figure 20J:
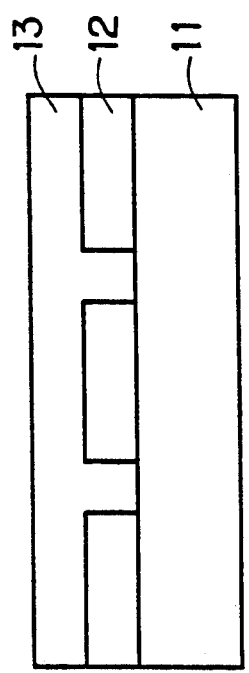

Then, as shown in FIGS. 19J and 20J, the second phase film 13 made of, for example, $SiO_2$ is formed on the first phase film 12, the light-blocking region 2 and the transparent substrate 11. In this case, the thickness $t_{13}$ of the second phase film 13 is determined as expressed by the formula (2), for example.

Figure 19K:
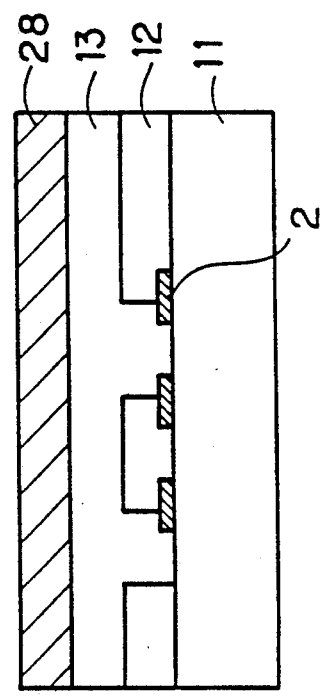
Figure 20K:
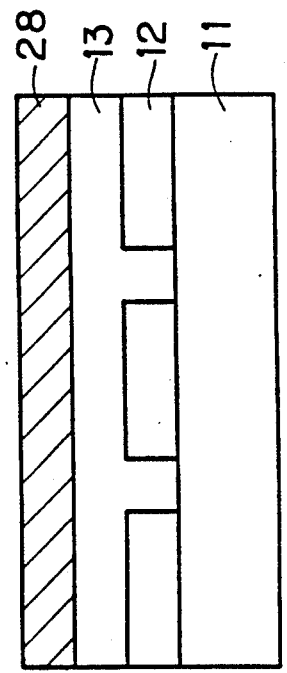
Figure 20L:
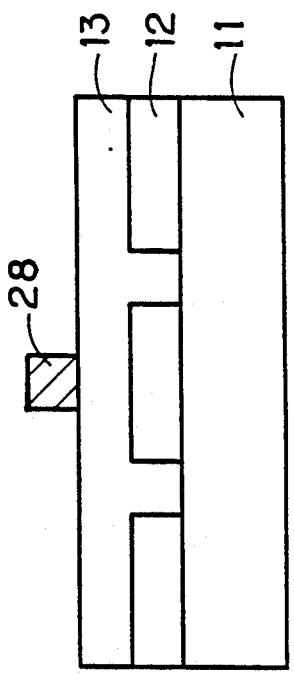
Figure 20M:
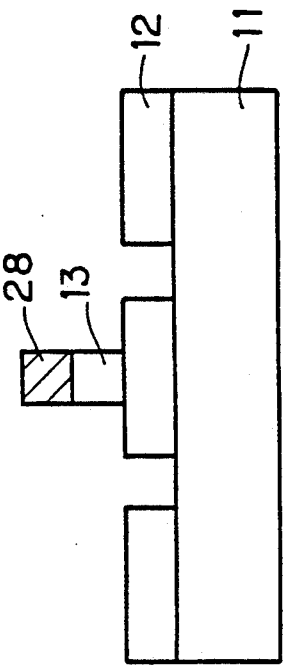
Figure 19L:
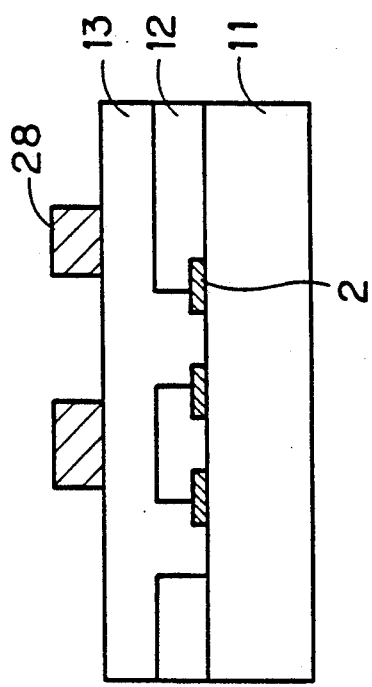
Figure 19M:
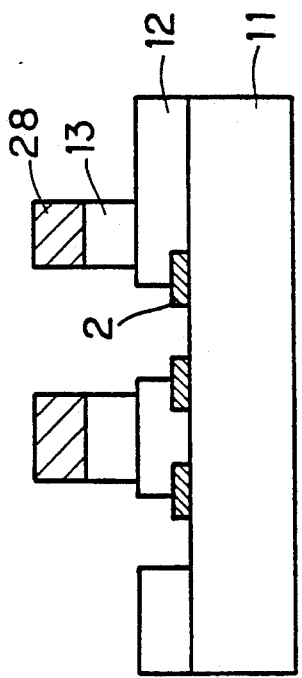
Figure 21:
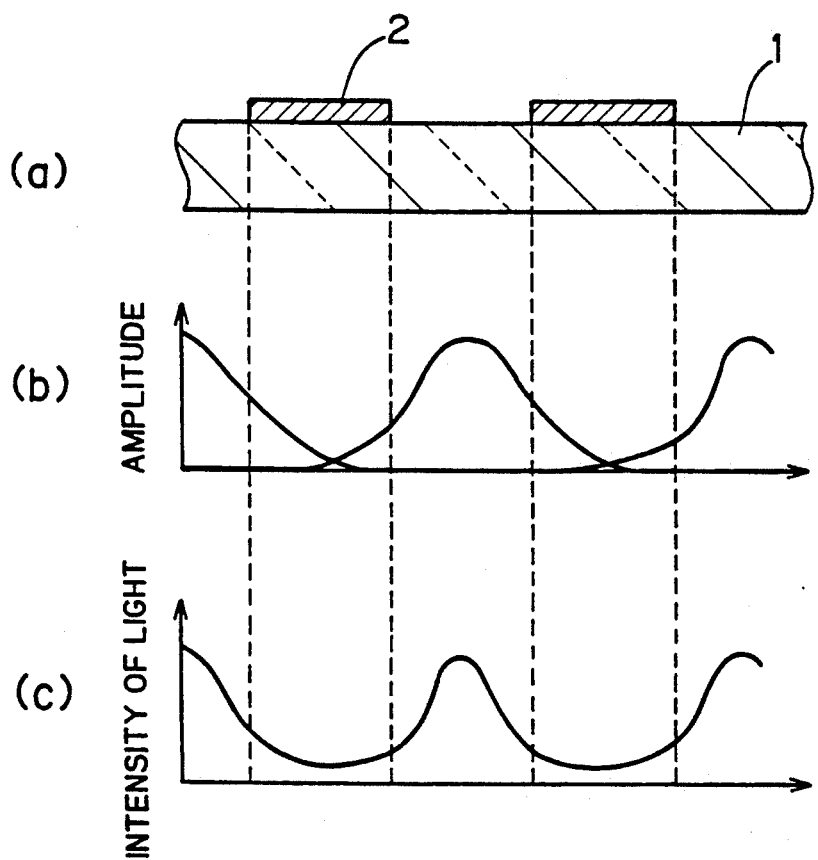
FIG. 21 is a diagram for explaining a prior art embodiment of a photomask.

After that, as shown in FIGS. 19K and 20K, the resist layer 28 is formed on the second phase film 13. Then, the resist layer 28 is selectively removed by an electron beam exposing method as shown in FIGS. 19L and 20L to create a pattern of the resist layer 28 in agreement with the pattern of the second phase region 16. Then, as shown in FIGS. 19M and 20M, the second phase film 13 is selectively removed by etching with a mask of the resist layer 28. In this way, the second phase film 13 is selectively formed on the region in the first phase film 12 corresponding to the second phase region 16. Eventually, removing the resist layer 28, the photomask 40 shown in FIGS. 19N and 20N, is obtained. (The 4th Step)

Although the phase films 12 and 13 are formed as single-layer films in the above-mentioned manufacturing methods, they may be formed as multi-layer films of $SiO_2/Si_3N_4$.

With a photomask according to the present invention, a mask pattern can be correctly transferred even if the mask pattern is defined by light-blocking regions configured like isolated islands; so the photomask is effective when used for forming element isolating regions, electric charge accumulating electrodes and the like in a semiconductor device, such as a 64-mega-DRAM and the like. It is also effective when used for forming wiring electrodes. Moreover, the present invention can be applied not only to manufacturing the semiconductor device but to manufacturing various electronic devices, such as a liquid crystal display and the like.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A photomask having a plurality of light-blocking regions arranged in parallel on a transparent member; the transparent member comprising:
    (a) first and second phase regions alternately disposed along the direction of arrays of the light-blocking regions, with each of the light-blocking regions interposing between them, and
    (b) a third phase region disposed adjacent to the first and second phase regions;
    the relations in phase between the first and second phase regions being arranged that the lights transmitted by the first and second phase regions have a phase difference enough to cancel with each other because of the interference; and the relations in phase of the third phase region to the first and second phase regions being arranged that the phase difference between the lights transmitted by the first and third phase regions, and the phase difference between the lights transmitted by the second and third phase regions are about a half of the phase difference between the lights transmitted by the first and second phase regions.

2. A photomask according to claim 1, wherein the phase difference between the lights transmitted by the first and second phase regions is 180°, while the phase differences between the lights transmitted by the first and third phase regions and between the lights transmitted by the second and third phase regions are 90°.

3. A photomask according to claim 1, wherein the phase difference between the first and third phase regions is determined by a first phase film formed on a transparent substrate, the phase difference between the second and third phase regions is determined by a second phase film formed on the first phase film, and the phase difference between the first and second phase regions is determined by the first and second phase films; and the light-blocking regions are formed on the second phase film.

4. A photomask according to claim 3, wherein the transparent substrate is made of $SiO_2$, the first phase film is made of $Si_3N_4$, the second phase film is made of $SiO_2$, and the light-blocking regions are made of Cr.

5. A photomask according to claim 1, wherein the phase difference among the first through third phase regions is determined by varying the thickness of a transparent substrate into a state where the second phase region is the largest in thickness, the third phase region is the second largest, and the first phase region is the smallest; and the light-blocking regions are formed on the region of the transparent substrate having the same thickness as the second phase region.

6. A photomask according to claim 5, wherein the transparent substrate is made of $SiO_2$, while the light-blocking regions are made of Cr.

7. A photomask according to claim 1, the phase difference between the first and third phase regions is determined by varying the thickness of a transparent substrate so that the first phase region is smaller in thickness than the third phase region; the phase difference between the second and third phase regions is determined by a phase film formed on the region of the transparent substrate having the same thickness as the third phase region; and the light-blocking regions are formed on the region of the transparent substrate having the same thickness as the third phase region.

8. A photomask according to claim 7, wherein the transparent substrate is made of $SiO_2$, the phase film is made of $Si_3N_4$, and the light-blocking regions are made of Cr.

9. A photomask according to claim 1, wherein the phase difference between the first and third phase regions is determined by a first phase film formed on a transparent substrate, the phase difference between the second and third phase regions is determined by the second phase film formed on the first phase film, and the phase difference between the first and second phase regions is determined by the first and second phase films; and the light-blocking regions are formed on the transparent substrate.

10. A photomask according to claim 9, wherein the transparent substrate is made of $SiO_2$, the first phase film is made of $Si_3N_4$, the second phase film is made of $SiO_2$, and the light-blocking regions are made of Cr.

11. A photomask according to claim 1, wherein the light-blocking regions are arranged in matrix.

12. A photomask according to claim 11, wherein the first and second phase regions are formed in a section where the light-blocking regions adjacent to each other overlap to each other in either of a row- or column-direction of the matrix.

13. A method of manufacturing a photomask having a plurality of light-blocking regions disposed in parallel, first and second phase regions alternately disposed along the direction of arrays of the light-blocking regions, with each of the light-blocking regions interposing between them, and a third phase region disposed adjacent to the first and second phase regions, comprising
    a first step of forming a first phase film, a second phase film and a light-blocking film on a transparent substrate in this order;
    a second step of forming the light-blocking regions disposed in parallel by selectively removing the light-blocking film by etching;
    a third step of selectively removing by etching the regions in the second phase film corresponding to the first and third phase regions, and
    a fourth step of selectively removing by etching the region in the first phase film corresponding to the first phase region.

14. A method according to claim 13, wherein the thickness $t_{12}$ of the first phase film is expressed as $$t_{12} = \frac{\lambda}{4(n_{12} - 1)}$$

where the wavelength of an exposing light is $\lambda$, and the refractive index of the first phase film is $n_{12}$.

15. A method according to claim 13, wherein the thickness $t_{13}$ of the second phase film is expressed as $$t_{13} = \frac{\lambda}{4(n_{13} - 1)}$$

where the wavelength of an exposing light is λ, and the refractive index of the second phase film is $n_{13}$.

16. A method of manufacturing a photomask having a plurality of light-blocking regions disposed in parallel, first and second phase regions alternately disposed along the direction of arrays of the light-blocking regions, with each of the light-blocking regions interposing between them, and a third phase region disposed adjacent to the first and second phase regions, comprising
a first step of forming a light-blocking film on a transparent substrate;
a second step of forming the light-blocking regions disposed in parallel by selectively removing the light-blocking film by etching;
a third step of selectively removing the region in an exposed region of the transparent substrate corresponding to the first and third phase regions by etching to a particular depth; and
a fourth step of further selectively removing the region in the exposed region of the transparent substrate corresponding to the first phase region by etching to a particular depth.

17. A method according to claim 16, wherein the etching depths $t_1$ and $t_2$ in the third and fourth steps are expressed as $$t_1 = t_2 = \frac{\lambda}{4(n_{11} - 1)}$$

where the wavelength of an exposing light is λ, and the refractive index of the transparent substrate is $n_{11}$.

18. A method of manufacturing a photomask having a plurality of light-blocking regions disposed in parallel, first and second phase regions alternately disposed along the direction of arrays of the light-blocking regions, with each of the light-blocking regions interposing between them, and a third phase region disposed adjacent to the first and second phase regions, comprising
a first step of forming a light-blocking film on a transparent substrate;
a second step of forming the light-blocking regions disposed in parallel by selectively removing the light-blocking film by etching;
a third step of selectively forming a phase film on the region in an exposed region of the transparent substrate corresponding to the second phase region; and
a fourth step of selectively removing the region in the exposed region of the transparent substrate corresponding to the first phase region by etching to a particular depth.

19. A method according to claim 18, wherein the thickness $t_{13}$ of the phase film is expressed as $$t_{13} = \frac{\lambda}{4(n_{13} - 1)}$$

where the wavelength of an exposing light is λ, and the refractive index of the phase film is $n_{13}$.

20. A method according to claim 18, wherein the etching depth $t_1$ in the fourth step is expressed as $$t_1 = \frac{\lambda}{4(n_{11} - 1)}$$

where the wavelength of an exposing light is λ, and the refractive index of the transparent substrate is $n_{11}$.

21. A method of manufacturing a photomask having a plurality of light-blocking regions disposed in parallel, first and second phase regions alternately disposed along the direction of arrays of the light-blocking regions, with each of the light-blocking regions interposing between them, and a third phase region disposed adjacent to the first and second phase regions, comprising
a first step of forming a light-blocking film on a transparent substrate;
a second step of forming the light-blocking regions disposed in parallel by selectively removing the light-blocking film by etching;
a third step of selectively forming a first phase film on the region in an exposed region of the transparent substrate corresponding to the second and third phase regions; and
a fourth step of selectively forming a second phase film on the region in the first phase film corresponding to the second phase region.

22. A method according to claim 21, wherein the thickness $t_{12}$ of the first phase film is expressed as $$t_{12} = \frac{\lambda}{4(n_{12} - 1)}$$

where the wavelength of an exposing light is λ, and the refractive index of the first phase film is $n_{12}$.

23. A method according to claim 21, wherein the thickness $t_{13}$ of the second phase film is expressed as $$t_{13} = \frac{\lambda}{4(n_{13} - 1)}$$

where the wavelength of an exposing light is λ, and the refractive index of the second phase film is $n_{13}$.

* * * * *